United States Patent
Jankus et al.

(10) Patent No.: US 11,011,723 B2
(45) Date of Patent: May 18, 2021

(54) ORGANIC ELECTROLUMINESCENT DEVICE COMPRISING A HOLE INJECTION LAYER AND ELECTRON INJECTION LAYER WITH ZERO-VALENT METAL

(71) Applicant: NOVALED GMBH, Dresden (DE)

(72) Inventors: Vygintas Jankus, Dresden (DE); Carsten Rothe, Dresden (DE); Domagoj Pavicic, Dresden (DE)

(73) Assignee: Novaled GmbH, Dresden (DE)

( * ) Notice: Subject to any disclaimer, the term of this patent is extended or adjusted under 35 U.S.C. 154(b) by 318 days.

(21) Appl. No.: 16/027,628

(22) Filed: Jul. 5, 2018

(65) Prior Publication Data

US 2019/0013492 A1    Jan. 10, 2019

(30) Foreign Application Priority Data

Jul. 7, 2017 (EP) .................................... 17180262

(51) Int. Cl.
| | | |
|---|---|---|
| *H01L 51/00* | (2006.01) | |
| *H01L 51/50* | (2006.01) | |
| *H01L 51/52* | (2006.01) | |
| *H01L 51/56* | (2006.01) | |

(52) U.S. Cl.
CPC ...... *H01L 51/5056* (2013.01); *H01L 51/0045* (2013.01); *H01L 51/0054* (2013.01);
(Continued)

(58) Field of Classification Search
CPC ............. H01L 51/5048; H01L 51/5052; H01L 51/5072; H01L 51/5088; H01L 51/5092;
(Continued)

(56) References Cited

U.S. PATENT DOCUMENTS

| | | |
|---|---|---|
| 6,140,763 A | 10/2000 | Hung et al. |
| 6,614,176 B2 | 9/2003 | Kim et al. |

(Continued)

FOREIGN PATENT DOCUMENTS

| | | | |
|---|---|---|---|
| EP | 2887416 A1 * | 6/2015 | ............. H01L 51/56 |
| EP | 3109916 A1 | 12/2016 | |

(Continued)

OTHER PUBLICATIONS

Ahn et al. "P-112: Highly Efficient Electron Injection Layer of LiF/Yb Bilayer for Top-emitting Organic Light Emitting Diodes," SID Symposium Digest of Technical Papers, 2012, vol. 43, Issue 1.

*Primary Examiner* — Lucas A Stelling
*Assistant Examiner* — Rachel Simbana
(74) *Attorney, Agent, or Firm* — Eversheds Sutherland (US) LLP

(57) ABSTRACT

The present invention relates to an organic electroluminescent device comprising an hole injection layer and electron injection layer with zero-valent metal, and a method of manufacturing the same. In particular the present invention relates to an organic electroluminescent device comprising an anode layer, at least one electron transport layer, at least one electron injection layer, a cathode layer, and an emission layer, wherein the emission layer is arranged between the anode layer and the cathode layer, wherein the at least a first electron transport layer and the injection layer are arranged between the emission layer and the cathode layer, wherein the electron injection layer is arranged in direct contact to the first transport electron layer, wherein the first electron transport layer is arranged nearer to the anode layer and the electron injection layer is arranged nearer to the cathode layer, wherein at least the first electron transport layer comprises an organic phosphine matrix compound, and a first zero-valent alkali metal; and the electron injection layer comprises a second zero-valent metal of an alkaline earth metal and/or rare earth metal, and an alkali metal halide.

16 Claims, 4 Drawing Sheets

(52) U.S. Cl.
CPC ...... *H01L 51/5072* (2013.01); *H01L 51/5076* (2013.01); *H01L 51/5092* (2013.01); *H01L 51/5206* (2013.01); *H01L 51/5221* (2013.01); *H01L 51/56* (2013.01)

(58) Field of Classification Search
CPC ............. H01L 51/5056; H01L 51/5076; H01L 51/0045; H01L 51/0054; H01L 51/5206; H01L 51/5221; H01L 51/56; H01L 51/0034; H01L 2251/301; Y02E 10/549
See application file for complete search history.

(56) References Cited

U.S. PATENT DOCUMENTS

| | | | |
|---|---|---|---|
| 2012/0261652 A1* | 10/2012 | Rothe | H01L 51/0026 257/40 |
| 2016/0248022 A1 | 8/2016 | Lee et al. | |
| 2016/0248034 A1* | 8/2016 | Kim | H01L 51/5084 |
| 2016/0343950 A1* | 11/2016 | Kawamura | C07F 9/655354 |
| 2017/0186981 A1 | 6/2017 | Han et al. | |

FOREIGN PATENT DOCUMENTS

| | | |
|---|---|---|
| EP | 3171418 A1 | 5/2017 |
| EP | 3182478 A1 | 6/2017 |
| EP | 3232490 A1 | 10/2017 |
| WO | 2013079217 A1 | 6/2013 |
| WO | 2013079676 A1 | 6/2013 |
| WO | 2013079678 A1 | 6/2013 |
| WO | 2015052284 A1 | 4/2015 |
| WO | 2016162440 A1 | 10/2016 |

* cited by examiner

ORGANIC ELECTROLUMINESCENT DEVICE COMPRISING A HOLE INJECTION LAYER AND ELECTRON INJECTION LAYER WITH ZERO-VALENT METAL

CROSS REFERENCE TO RELATED APPLICATION

This application claims priority to European Application No. 17180262.2, filed Jul. 7, 2017. The contents of this application is hereby incorporated by reference.

TECHNICAL FIELD

The present invention relates to an organic electroluminescent device comprising a hole injection layer and electron injection layer with zero-valent metal, and a method of manufacturing the same.

BACKGROUND ART

Organic electroluminescent devices, such as organic light-emitting diodes OLEDs, which are self-emitting devices, have a wide viewing angle, excellent contrast, quick response, high brightness, excellent operating voltage characteristics, and color reproduction. A typical OLED comprises an anode, a hole transport layer HTL, an emission layer EML, an electron transport layer ETL, and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and/or a long lifetime.

US2016248022 (A1) discloses an organic light-emitting device including: a first electrode; a second electrode facing the first electrode; and an organic layer between the first electrode and the second electrode, the organic layer including an emission layer, wherein the organic layer further includes: i) a hole transport region between the first electrode and the emission layer, the hole transport region including at least one selected from a hole transport layer, a hole injection layer, and a buffer layer, and ii) an electron transport region between the emission layer and the second electrode, the electron transport region including an electron transport layer and at least one selected from a hole blocking layer and an electron injection layer; and wherein the electron transport region includes a compound represented by Formula 1 or a compound represented by Formula 2:

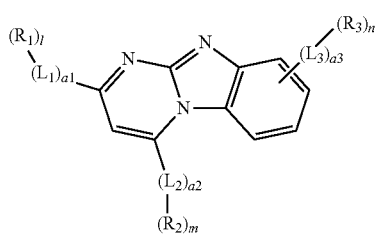

Formula 1

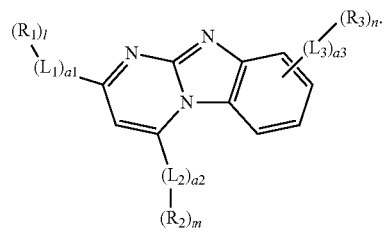

Formula 2

Hyuo Ahn et al., "P-112: Highly Efficient Electron Injection Layer of LiF/Yb Bilayer for Top-emitting Organic Light Emitting Diodes", SID International Symposium. Digest of Technical Papers, vol. 43, no. 1, 1 Jun. 2012, report highly efficient electron injection layer (EIL) of LiF/Yb bilayer for top-emitting organic light emitting diodes. The device with the LIF/Yb bilayer shows reduced operating voltage and enhanced efficiencies compared to other two devices with Yb and LiF/Al due to the reduced electron injection barrier, resulting in better charge balance. The device with the LiF/Yb bilayer shows high luminous efficiency of 53.2 cd/A and external quantum efficiency of 16.9%.

EP3182478 (A1) relates to Organic light emitting diode comprising at least one emission layer, an electron injection layer and at least one cathode electrode, wherein: —the electron injection layer comprises an organic phosphine compound, wherein the electron injection layer is free of a metal, metal salt, metal complex and metal organic compound; —the cathode electrode comprises at least a first cathode electrode layer, wherein—the first cathode electrode layer comprises a first zero-valent metal selected from the group comprising alkali metal, alkaline earth metal, rare earth metal and/or a group 3 transition metal; and—the electron injection layer is arranged in direct contact to the first cathode electrode layer.

US2017186981 (A1) discloses an organic light-emitting device includes a first electrode, a second electrode facing the first electrode, and an emission layer disposed between the first electrode and the second electrode. An electron transport region is between the second electrode and the emission layer. The electron transport region includes an electron injection layer including a first component including at least one halide of an alkali metal (Group I), a second component including at least one organometallic compound, and a third component including at least one of a lanthanide metal or an alkaline earth metal (Group II).

EP3109916 (A1) relates to an electronic device comprising at least one light emitting layer between an anode and a substantially silver cathode, the device further comprising between the cathode and the anode at least one mixed layer comprising (i) at least one substantially covalent electron transport matrix compound comprising at least one polar group selected from phosphine oxide group or diazole group, and (ii) in substantially elemental form, an electropositive element selected from substantially non-radioactive alkali metals, alkaline earth metals, rare earth metals, and transition metals of the fourth period of the Periodic table having proton numbers 22, 23, 24, 25, 26, 27, 28, 29.

Performance of an organic light emitting diode may be affected by characteristics of the organic semiconductor layer, and among them, may be affected by characteristics of an organic material of the organic semiconductor layer.

Particularly, development for an organic material being capable of increasing electron mobility and simultaneously increasing electrochemical stability is needed so that the organic electroluminescent device, such as an organic light emitting diode, may be applied to a large-size flat panel display.

There remains a need to improve performance of organic semiconductor layers, organic semiconductor materials, as well as organic electroluminescent devices thereof, in particular to achieve higher efficiency and/or longer lifetime through improving the characteristics of the compounds comprised therein.

In particular there is a need for organic semiconductor materials and organic semiconductor layers as well as organic electroluminescent devices with improved conductivity and thereby reduced operating voltage.

There is a need for a reduced operating voltage and thereby reduced power consumption and increased battery life, for example of mobile electroluminescent devices, as well as for increased efficiency and lifetime in such devices.

DISCLOSURE

An aspect of the present invention provides an organic electroluminescent device comprising an anode layer, at least one electron transport layer, at least one electron injection layer, a cathode layer, and an emission layer,
wherein
 the emission layer is arranged between the anode layer and the cathode layer,
wherein
 the at least a first electron transport layer and the injection layer are arranged between the emission layer and the cathode layer,
wherein
 the electron injection layer is arranged in direct contact to the first transport electron layer,
wherein
 the first electron transport layer is arranged nearer to the anode layer and the electron injection layer is arranged nearer to the cathode layer,
wherein
 at least the first electron transport layer comprises:
  an organic phosphine matrix compound, and
  a first zero-valent alkali metal; and
 the electron injection layer comprises:
  a second zero-valent metal of an alkaline earth metal and/or rare earth metal, and
  an alkali metal halide.

According to another aspect, the organic electroluminescent device comprising an anode layer, at least one electron transport layer, at least one electron injection layer, a cathode layer, and an emission layer,
wherein
 the emission layer is arranged between the anode layer and the cathode layer,
wherein
 the at least a first electron transport layer and the injection layer are arranged between the emission layer and the cathode layer,
wherein
 the electron injection layer is arranged in direct contact to the first transport electron layer,
wherein
 the first electron transport layer is arranged nearer to the anode layer and the electron injection layer is arranged nearer to the cathode layer,
wherein
 at least the first electron transport layer comprises:
  an organic phosphine matrix compound, and
  a first zero-valent alkali metal; and
 the electron injection layer comprises:
  a second zero-valent metal of an alkaline earth metal and/or rare earth metal, and
  an alkali metal halide;
wherein the first electron injection layer comprises 10 to 98 vol.-% second zero-valent metal of an alkaline earth metal and/or rare earth metal and 2 to 90 vol.-% alkali halide, wherein the vol.-% is based on the total vol.-% of the first electron injection layer.

According to another embodiment, the first electron transport layer (ETL) and/or electron injection layer (EIL) may be essentially non-emissive or non-emissive.

According to another embodiment, the first electron transport layer (ETL) may be:
 essentially non-emissive or non-emissive, and/or
 free of covalently bound metal, and/or
 free of ionically bound metal, wherein the metal is selected from the group consisting of group III to VI, rare earth and transition metal.

According to another embodiment, the first electron transport layer (ETL) may be free of alkali halide.

In the context of the present specification the term "essentially non-emissive" or "non-emissive" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

The term "free of", "does not contain", "does not comprise" does not exclude impurities which may be present in the compounds prior to deposition. Impurities have no technical effect with respect to the object achieved by the present invention.

In the context of the present invention, the term "in direct contact" means in touch contact.

The operating voltage, also named U, is measured in Volt (V) at 10 milliAmpere per square centimeter (mA/cm2).

The candela per Ampere efficiency, also named cd/A efficiency, is measured in candela per ampere at 10 milliAmpere per square centimeter (mA/cm2).

The external quantum efficiency, also named EQE, is measured in percent (%).

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED", "organic light emitting diode", "light emitting device", "organic optoelectronic device" and "organic light-emitting diode" are simultaneously used and have the same meaning.

The term "transition metal" means and comprises any element in the d-block of the periodic table, which comprises groups 3 to 12 elements on the periodic table.

The term "group III to VI metal" means and comprises any metal in groups III to VI of the periodic table.

The term "life-span" and "lifetime" are simultaneously used and have the same meaning.

As used herein, "weight percent", "wt.-Old", "percent by weight", "% by weight", and variations thereof refer to a composition, component, substance or agent as the weight of that composition, component, substance or agent of the respective electron transport layer divided by the total weight of the composition thereof and multiplied by 100. It is understood that the total weight percent amount of all components, substances or agents of the respective electron transport layer are selected such that it does not exceed 100 wt.-%.

As used herein, "volume percent", "vol.-%", "percent by volume", "% by volume", and variations thereof refer to an elemental metal, a composition, component, substance or agent as the volume of that elemental metal, component, substance or agent of the respective electron transport layer divided by the total volume of the respective electron transport layer thereof and multiplied by 100. It is understood that the total volume percent amount of all elemental metal, components, substances or agents of the respective cathode electrode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not, modified by the term "about", the claim include equivalents to the quantities.

It should be noted that, as used in this specification and the appended claim, the singular forms "a", "an", and "the" include plural referents unless the content clearly dictates otherwise.

The anode electrode and cathode electrode may be described as anode electrode/cathode electrode or anode electrode/cathode electrode or anode electrode layer/cathode electrode layer.

According to yet another aspect, a display device comprising the organic optoelectronic device is provided.

According to yet another aspect a method of manufacture of at least a first electron transport layer and an electron injection layer of an organic electroluminescent device is provided.

In the present specification, when a definition is not otherwise provided, an "alkyl group" may refers to an aliphatic hydrocarbon group. The alkyl group may refer to "a saturated alkyl group" without any double bond or triple bond.

The alkyl group may be a $C_1$ to $C_{12}$ alkyl group. More specifically, the alkyl group may be a $C_1$ to $C_{10}$ alkyl group or a $C_1$ to $C_6$ alkyl group. For example, a $C_1$ to $C_4$ alkyl group comprises 1 to 4 carbons in alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

In the present specification "arylene group" may refer to a group comprising at least one hydrocarbon aromatic moiety, and all the elements of the hydrocarbon aromatic moiety may have p-orbitals which form conjugation, for example a phenyl group, a naphthyl group, an anthracenyl group, a phenanthrenyl group, a pyrenyl group, a fluorenyl group and the like.

The arylene group may include a monocyclic, polycyclic or fused ring polycyclic (i.e., rings sharing adjacent pairs of carbon atoms) functional group.

The term "heteroarylene" refers to aromatic heterocycles with at least one heteroatom, and all the elements of the hydrocarbon heteroaromatic moiety may have p-orbitals which form conjugation.

The heteroatom may be selected from N, O, S, B, Si, P, Se, preferably from N, O and S. The term "heteroarylene" as used herewith shall encompass pyridine, quinoline, quinazoline, pyridine, triazine, benzimidazole, benzothiazole, benzo[4,5]thieno[3,2-d]pyrimidine, carbazole, xanthene, phenoxazine, benzoacridine, dibenzoacridine and the like.

In the present specification, the single bond refers to a direct bond.

The term "$C_6$-arylene rings" means single $C_6$-arylene rings and $C_6$-arylene rings, which form condensed ring systems. For example, a naphthylene group would be counted as a two condensed $C_6$-arylene rings.

The term "zero-valent" metal means 0-valent.

For example during deposition of the metal or by forming the layer comprising a "zero-valent" metal, the zero-valent metal has a valency of 0. After deposition or before reverse engineering, the zero-valent metal, for example of the electron injection layer or electron transport layer, may react to form a metal halide, metal compound and/or metal complex.

According to another aspect, the first zero-valent alkali metal of the electron transport layer and the alkali metal of the alkali metal halide of the electron injection layer may be the same.

According to another aspect, the first electron transport layer may comprise a gradient distribution of the first zero-valent alkali metal.

According to another aspect, the first electron transport layer may comprises a gradient distribution of the first zero-valent alkali metal, wherein it can be preferred that the concentration of the first zero-valent alkali metal of the electron transport layer increases in the direction to the electron injection layer.

According to another aspect, the first zero-valent alkali metal may be selected from Li, Na, K and Rb, preferably Na, K, Rb, and most preferred can be K or Rb.

According to another aspect, the first zero-valent alkali metal may be a mixture of at least to different zero-valent alkali metals selected from Li, Na, K and Rb, and most preferred the mixture comprises K and/or Rb.

According to another aspect, the alkali metal halide is selected from an alkali metal chloride, bromide or iodide, preferably alkali metal iodide.

According to another aspect, the alkali metal halide is selected from an alkali metal iodide, preferably KI or RbI. According to another aspect, the second zero-valent metal is selected from a rare earth metal, preferably Eu or Yb, even more preferred Yb.

According to another aspect, the organic phosphine matrix compound of the at least first electron transport layer may comprises at least one P=X group, wherein X is O, S or Se.

According to another aspect, the organic phosphine matrix compound of the at least first electron transport layer may comprises at least one P=X group, wherein X can be preferably O.

According to another aspect, the organic phosphine matrix compound of the at least first electron transport layer may have a molecular weight of ≥400 and ≤1800 g/mol.

According to another aspect, the organic phosphine matrix compound of the at least first electron transport layer may have a molecular weight of ≥450 and ≤1700 g/mol, preferably a molecular weight of ≥500 and ≤1600 g/mol, further preferred a molecular weight of ≥550 and ≤1600 g/mol, in addition preferred a molecular weight of ≥600 and ≤1500 g/mol and further more preferred a molecular weight of ≥700 and ≤1400 g/mol.

If the molecular weight is selected in this range, particularly reproducible evaporation and deposition can be achieved in vacuum at temperatures where good long-term stability is observed.

According to another aspect, the organic phosphine matrix compound of the at least first electron transport layer may comprise at least one triazine group.

According to another aspect, the organic phosphine matrix compound of the at least first electron transport layer may comprise at least one pyrimidine group.

According to another aspect, the organic phosphine matrix compound of the at least first electron transport layer may comprise at least one $C_{10}$ to $C_{40}$ aryl group.

According to another aspect, the organic phosphine matrix compound of the at least first electron transport layer may comprises at least one $C_{10}$ to $C_{40}$ aryl group, wherein at least two rings are annelated.

According to another aspect, the organic phosphine matrix compound of the at least first electron transport layer may comprises at least one $C_{10}$ to $C_{40}$ aryl group, which are selected from naphthalene, anthracene, quinozaline, acridine, benzo acridine and/or dibenzo acridine.

According to another aspect, the organic phosphine matrix compound of the at least first electron transport layer may comprise at least one $C_3$ to $C_{40}$ heteroaryl group.

According to another aspect, the organic phosphine matrix compound of the at least first electron transport layer may comprises at least one $C_3$ to $C_{40}$ heteroaryl group, wherein at least two rings are annelated.

According to another aspect, the organic phosphine matrix compound of the at least first electron transport layer may comprises at least one group selected from:
triazine,
pyrimidine,
$C_{10}$ to $C_{40}$ aryl, wherein at least two rings are annelated, and preferably selected from naphthalene, anthracene, quinozaline, acridine, benzo acridine and/or dibenzo acridine,
$C_3$ to $C_{40}$ heteroaryl, wherein at least two rings are annelated.

According to another aspect, the organic phosphine matrix compound of the at least first electron transport layer may be represented by a compound having the Formula I:

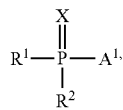

Formula (I)

wherein:
X is selected from O, S, Se and preferably O;
$R^1$ and $R^2$ are independently selected from $C_1$ to $C_{12}$ alkyl, $C_6$ to $C_{20}$ aryl, $C_3$ to $C_{20}$ heteroaryl; or $R_1$ and $R^2$ are bridged with an alkene-di-yl group forming with the P atom a five, six or seven membered ring; and
$A^1$ is $C_1$ to $C_{12}$ alkyl, $C_6$ to $C_{40}$ aryl, $C_3$ to $C_{40}$ heteroaryl.

According to another aspect, the organic phosphine matrix compound of the at least first electron transport layer may be represented by a compound having the Formula I:

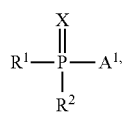

Formula (I)

wherein:
X is selected from O, S, Se and preferably O;
$R^1$ and $R^2$ are independently selected from substituted $C_1$ to $C_{12}$ alkyl, substituted $C_6$ to $C_{20}$ aryl, or substituted $C_3$ to $C_{20}$ heteroaryl; or $R^1$ and $R^2$ are bridged with an alkene-di-yl group forming with the P atom a substituted five, six or seven membered ring;
wherein the substituent on $C_1$ to $C_{12}$ alkyl is selected from $C_6$ to $C_{18}$ aryl, the substituent on $C_6$ to $C_{20}$ aryl and/or $C_3$ to $C_{20}$ heteroaryl is selected from $C_1$ to $C_{12}$ alkyl or $C_1$ to $C_{12}$ heteroalkyl; and
$A'$ is substituted $C_1$ to $C_{12}$ alkyl, substituted $C_6$ to $C_{40}$ aryl, substituted $C_3$ to $C_{40}$ heteroaryl,
wherein the substituent on $C_1$ to $C_{12}$ alkyl is selected from $C_6$ to $C_{18}$ aryl, and the substituent on $C_6$ to $C_{40}$ aryl and/or $C_3$ to $C_{40}$ heteroaryl is selected from $C_1$ to $C_{12}$ alkyl or $C_1$ to $C_{12}$ heteroalkyl According to another aspect, the organic phosphine matrix compound of the at least first electron transport layer may be represented by a compound having the Formula I:

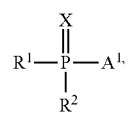

Formula (I)

wherein:
X is selected from O, S, Se and preferably O;
$R^1$ and $R^2$ are independently selected from $C_1$ to $C_{12}$ alkyl, $C_6$ to $C_{20}$ aryl, or $C_3$ to $C_{20}$ heteroaryl; or $R^1$ and $R^2$ are bridged with an alkene-di-yl group forming with the P atom a five, six or seven membered ring; and
$A^1$ is selected from Formula (II):

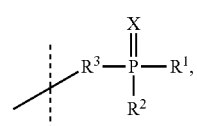

Formula (II)

wherein
$R^3$ is selected from $C_1$ to $C_8$ alkane-di-yl, $C_6$ to $C_{20}$ arylene, or $C_3$ to $C_{20}$ heteroarylene.

According to another aspect, the organic phosphine matrix compound of the at least first electron transport layer may be represented by a compound having the Formula I:

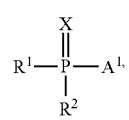

Formula (I)

wherein:
X is selected from O, S, Se and preferably O;
$R^1$ and $R^2$ are independently selected from substituted $C_1$ to $C_{12}$ alkyl, substituted $C_6$ to $C_{20}$ aryl, or substituted $C_3$ to $C_{20}$ heteroaryl; or $R^1$ and $R^2$ are bridged with an alkene-di-yl group forming with the P atom a substituted five, six or seven membered ring;
wherein the substituent on $C_1$ to $C_{12}$ alkyl is selected from $C_6$ to $C_{18}$ aryl, the substituent on $C_6$ to $C_{20}$ aryl and/or $C_3$ to $C_{20}$ heteroaryl is selected from $C_1$ to $C_{12}$ alkyl or $C_1$ to $C_{12}$ heteroalkyl; and $A^1$ is substituted $C_1$ to $C_{12}$ alkyl, substituted $C_6$ to $C_{40}$ aryl, substituted $C_3$ to $C_{40}$ heteroaryl,
  wherein the substituent on $C_1$ to $C_{12}$ alkyl is selected from $C_6$ to $C_{18}$ aryl, and the substituent on $C_6$ to $C_{40}$ aryl and/or $C_3$ to $C_{40}$ heteroaryl is selected from $C_1$ to $C_{12}$ alkyl or $C_1$ to $C_{12}$ heteroalkyl.

According to another aspect, the organic phosphine matrix compound of the at least first electron transport layer may be represented by a compound having the Formula I:

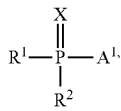

Formula (I)

wherein:
X is selected from O, S, Se and preferably O;
$R^1$ and $R^2$ are independently selected from $C_1$ to $C_{12}$ alkyl, $C_6$ to $C_{20}$ aryl, or $C_3$ to $C_{20}$ heteroaryl; or $R^1$ and $R^2$ are bridged with an alkene-di-yl group forming with the P atom a five, six or seven membered ring; and
$A^1$ is selected from Formula (III)

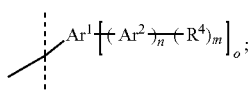

Formula (III)

wherein
n is selected from 0 or 1;
m is selected from 1 or 2;
o is selected from 1 or 2;
and wherein m is 1 if o is 2;
$Ar^1$ is selected from $C_6$ to $C_{20}$ arylene or $C_3$ to $C_{20}$ heteroarylene;
$Ar^2$ is selected from $C_{10}$ to $C_{40}$ arylene or $C_3$ to $C_{40}$ heteroarylene;
$R^4$ is selected from H, $C_1$ to $C_{12}$ alkyl, $C_6$ to $C_{20}$ aryl or $C_3$ to $C_{20}$ heteroaryl.

According to another aspect, the organic phosphine matrix compound of the at least first electron transport layer may be represented by a compound having the Formula I:

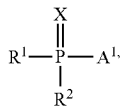

Formula (I)

wherein:
X is selected from O, S, Se and preferably O;
$R^1$ and $R^2$ are independently selected from substituted $C_1$ to $C_{12}$ alkyl, substituted $C_6$ to $C_{20}$ aryl, or substituted $C_3$ to $C_{20}$ heteroaryl; or $R^1$ and $R^2$ are bridged with an alkene-di-yl group forming with the P atom a substituted five, six or seven membered ring;
  wherein the substituent on $C_1$ to $C_{12}$ alkyl is selected from $C_6$ to $C_{18}$ aryl, the substituent on $C_6$ to $C_{20}$ aryl and/or $C_3$ to $C_{20}$ heteroaryl is selected from $C_1$ to $C_{12}$ alkyl or $C_1$ to $C_{12}$ heteroalkyl; and $A^1$ is selected from Formula (III)

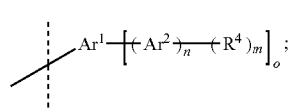

Formula (III)

wherein
n is selected from 0 or 1;
m is selected from 1 or 2;
o is selected from 1 or 2;
and wherein m is 1 if o is 2;
$Ar^1$ is selected from substituted $C_6$ to $C_{20}$ arylene or substituted $C_3$ to $C_{20}$ heteroarylene,
  wherein the substituent on $C_6$ to $C_{20}$ arylene or $C_3$ to $C_{20}$ heteroarylene is selected from $C_1$ to $C_{12}$ alkyl and/or $C_1$ to $C_{12}$ heteroalkyl;
$Ar^2$ is selected from substituted $C_{10}$ to $C_{40}$ arylene or substituted $C_3$ to $C_{40}$ heteroarylene,
  wherein the substituent on $C_{10}$ to $C_{40}$ arylene or $C_3$ to $C_{40}$ heteroarylene is selected from $C_1$ to $C_{12}$ alkyl, $C_1$ to $C_{12}$ heteroalkyl, OH, CN and/or halogen;
$R^4$ is selected from H, $C_1$ to $C_{12}$ alkyl, substituted $C_6$ to $C_{20}$ aryl or substituted $C_3$ to $C_{20}$ heteroaryl,
  wherein the substituent on $C_6$ to $C_{20}$ aryl or $C_3$ to $C_{20}$ heteroaryl is selected from $C_1$ to $C_{12}$ alkyl, $C_1$ to $C_{12}$ heteroalkyl, $C_6$ to $C_{20}$ aryl, $C_5$ to $C_{20}$ heteroaryl, OH, CN and/or halogen.

According to another aspect, the organic phosphine matrix compound of the at least first electron transport layer may be represented by a compound having the Formula I:

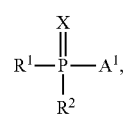

Formula (I)

wherein:
X is selected from O, S, Se and preferably O;
$R^1$ and $R^2$ are independently selected from substituted or unsubstituted $C_1$ to $C_{12}$ alkyl, substituted or unsubstituted $C_6$ to $C_{20}$ aryl, or substituted or unsubstituted $C_3$ to $C_{20}$ heteroaryl; or $R^1$ and $R^2$ are bridged with an alkene-di-yl group forming with the P atom a substituted or unsubstituted five, six or seven membered ring;
  wherein the substituent on $C_1$ to $C_{12}$ alkyl is selected from $C_6$ to $C_{18}$ aryl, the substituent on $C_6$ to $C_{20}$ aryl and/or $C_3$ to $C_{20}$ heteroaryl is selected from $C_1$ to $C_{12}$ alkyl or $C_1$ to $C_{12}$ heteroalkyl; and
$A^1$ is substituted or unsubstituted $C_1$ to $C_{12}$ alkyl, $C_6$ to $C_{40}$ aryl, $C_3$ to $C_{40}$ heteroaryl,
  wherein the substituent on $C_1$ to $C_{12}$ alkyl is selected from $C_6$ to $C_{18}$ aryl, and the substituent on $C_6$ to $C_{40}$ aryl and/or $C_3$ to $C_{40}$ heteroaryl is selected from $C_1$ to $C_{12}$ alkyl or $C_1$ to $C_{12}$ heteroalkyl;
or
$A^1$ is selected from Formula (II):

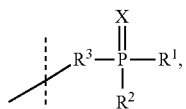

Formula (II)

wherein
$R^3$ is selected from $C_1$ to $C_8$ alkane-di-yl, substituted or unsubstituted $C_6$ to $C_{20}$ arylene, or substituted or unsubstituted $C_3$ to $C_{20}$ heteroarylene,
wherein the substituent on $C_6$ to $C_{20}$ arylene, and/or $C_3$ to $C_{20}$ heteroarylene is selected from $C_1$ to $C_{12}$ alkyl or $C_1$ to $C_{12}$ heteroalkyl;
or
$A^1$ is selected from Formula (III)

Formula (III)

wherein
n is selected from 0 or 1;
m is selected from 1 or 2;
o is selected from 1 or 2;
and wherein m is 1 if o is 2;
$Ar^1$ is selected from substituted or unsubstituted $C_6$ to $C_{20}$ arylene or substituted or unsubstituted $C_3$ to $C_{20}$ heteroarylene,
wherein the substituent on $C_6$ to $C_{20}$ arylene or $C_3$ to $C_{20}$ heteroarylene is selected from $C_1$ to $C_{12}$ alkyl and/or $C_1$ to $C_{12}$ heteroalkyl;
$Ar^2$ is selected from substituted or unsubstituted $C_{10}$ to $C_{40}$ arylene or substituted or unsubstituted $C_3$ to $C_{40}$ heteroarylene,
wherein the substituent on $C_{10}$ to $C_{40}$ arylene or $C_3$ to $C_{40}$ heteroarylene is selected from $C_1$ to $C_{12}$ alkyl, $C_1$ to $C_{12}$ heteroalkyl, OH, CN and/or halogen;
$R^4$ is selected from H, $C_1$ to $C_{12}$ alkyl, substituted or unsubstituted $C_6$ to $C_{20}$ aryl or substituted or unsubstituted $C_3$ to $C_{20}$ heteroaryl,
wherein the substituent on $C_6$ to $C_{20}$ aryl or $C_3$ to $C_{20}$ heteroaryl is selected from $C_1$ to $C_{12}$ alkyl, $C_1$ to $C_{12}$ heteroalkyl, $C_6$ to $C_{20}$ aryl, $C_5$ to $C_{20}$ heteroaryl, OH, CN and/or halogen.

According to another aspect, the organic phosphine matrix compound of the at least first electron transport layer may be represented by a compound having the Formula I:

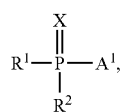

Formula (I)

wherein:
X is selected from O, S, Se and preferably O;
$R^1$ and $R^2$ are independently selected from $C_1$ to $C_{12}$ alkyl, $C_6$ to $C_{20}$ aryl, or $C_3$ to $C_{20}$ heteroaryl; or $R^1$ and $R^2$ are bridged with an alkene-di-yl group forming with the P atom a five, six or seven membered ring; and
$A^1$ is selected from Formula (III)

Formula (III)

wherein
n is selected from 0 or 1;
m is selected from 1 or 2;
o is selected from 1 or 2;
and wherein m is 1 if o is 2;
$Ar^1$ is selected from substituted $C_6$ to $C_{20}$ arylene, and/or substituted $C_3$ to $C_{20}$ heteroarylene,
wherein the $C_6$ to $C_{20}$ arylene, and/or $C_3$ to $C_{20}$ heteroarylene is substituted with at least one $C_1$ to $C_{12}$ alkyl and/or at least one $C_1$ to $C_{12}$ heteroalkyl group;
$Ar^2$ is selected from substituted $C_{10}$ to $C_{40}$ arylene and/or substituted $C_3$ to $C_{40}$ heteroarylene,
wherein the $C_{18}$ to $C_{40}$ arylene and/or $C_3$ to $C_{40}$ heteroarylene is substituted with at least one $C_1$ to $C_{12}$ alkyl and/or at least one $C_1$ to $C_{12}$ heteroalkyl group;
$R^4$ is selected from H, $C_1$ to $C_{12}$ alkyl, $C_6$ to $C_{20}$ aryl or $C_3$ to $C_{20}$ heteroaryl.

According to another aspect, the organic phosphine matrix compound of the at least first electron transport layer may be represented by a compound having the Formula I:

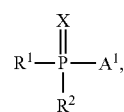

Formula (I)

wherein:
X is selected from O, S, Se and preferably O;
$R^1$ and $R^2$ are independently selected from $C_1$ to $C_{12}$ alkyl, $C_6$ to $C_{20}$ aryl, or $C_3$ to $C_{20}$ heteroaryl; or $R^1$ and $R^2$ are bridged with an alkene-di-yl group forming with the P atom a five, six or seven membered ring; and
$A^1$ is selected from Formula (III)

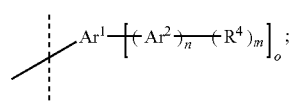

Formula (III)

wherein
n is selected from 0 or 1;
m is selected from 1 or 2;
o is selected from 1 or 2;
and wherein m is 1 if o is 2;
$Ar^1$ is selected from substituted $C_6$ to $C_{20}$ arylene and/or substituted $C_3$ to $C_{20}$ heteroarylene,
wherein the $C_6$ to $C_{20}$ arylene and/or $C_3$ to $C_{20}$ heteroarylene is substituted with at least one $C_1$ to $C_6$ alkyl and/or $C_1$ to $C_6$ heteroalkyl group;
$Ar^2$ is selected from substituted $C_{10}$ to $C_{40}$ arylene and/or substituted $C_3$ to $C_{40}$ heteroarylene,
wherein the $C_{18}$ to $C_{40}$ arylene and/or $C_3$ to $C_{40}$ heteroarylene is substituted with at least one $C_1$ to $C_6$ alkyl and/or $C_1$ to $C_6$ heteroalkyl group;
$R^4$ is selected from H, $C_1$ to $C_{12}$ alkyl, $C_6$ to $C_{20}$ aryl or $C_3$ to $C_{20}$ heteroaryl.

According to another aspect, the organic phosphine matrix compound of the at least first electron transport layer may be represented by a compound having the Formula I:

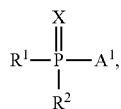
Formula (I)

wherein:
X is selected from O, S, Se and preferably O;
$R^1$ and $R^2$ are independently selected from $C_1$ to $C_{12}$ alkyl, $C_6$ to $C_{20}$ aryl, or $C_3$ to $C_{20}$ heteroaryl; or $R^1$ and $R^2$ are bridged with an alkene-di-yl group forming with the P atom a five, six or seven membered ring; and
$A^1$ is selected from Formula (III)

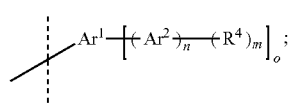
Formula (III)

wherein
n is selected from 0 or 1;
m is selected from 1 or 2;
o is selected from 1 or 2;
and wherein m is 1 if o is 2;
$Ar^1$ is selected from substituted $C_6$ to $C_{20}$ arylene and/or substituted $C_3$ to $C_{20}$ heteroarylene,
  wherein the $C_6$ to $C_{20}$ arylene and/or $C_3$ to $C_{20}$ heteroarylene is substituted with at least one $C_1$ to $C_4$ alkyl and/or $C_1$ to $C_4$ heteroalkyl group;
$Ar^2$ is selected from substituted $C_{10}$ to $C_{40}$ arylene and/or substituted $C_3$ to $C_{40}$ heteroarylene,
  wherein the $C_{18}$ to $C_{40}$ arylene and/or $C_3$ to $C_{40}$ heteroarylene is substituted with at least one $C_1$ to $C_4$ alkyl and/or $C_1$ to $C_4$ heteroalkyl group;
$R^4$ is selected from H, $C_1$ to $C_{12}$ alkyl, $C_6$ to $C_{20}$ aryl or $C_3$ to $C_{20}$ heteroaryl.

According to another aspect, $A^1$ can be selected from Formula (III)

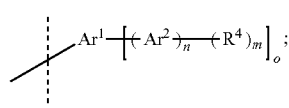
Formula (III)

wherein
$Ar^1$ is selected from substituted $C_6$ to $C_{20}$ arylene, and/or substituted $C_3$ to $C_{20}$ heteroarylene,
  wherein the $C_6$ to $C_{20}$ arylene, and/or $C_3$ to $C_{20}$ heteroarylene is substituted with at least one $C_1$ to $C_{12}$ alkyl and/or at least one $C_1$ to $C_{12}$ heteroalkyl group;
$Ar^2$ is selected from substituted $C_{10}$ to $C_{40}$ arylene and/or substituted $C_3$ to $C_{40}$ heteroarylene,
  wherein the $C_{18}$ to $C_{40}$ arylene and/or $C_3$ to $C_{40}$ heteroarylene is substituted with at least one $C_1$ to $C_{12}$ alkyl and/or at least one $C_1$ to $C_{12}$ heteroalkyl group;
preferably $Ar^1$ is selected from substituted $C_6$ to $C_{20}$ arylene and/or substituted $C_3$ to $C_{20}$ heteroarylene,
  wherein the $C_6$ to $C_{20}$ arylene and/or $C_3$ to $C_{20}$ heteroarylene is substituted with at least one $C_1$ to $C_6$ alkyl and/or $C_1$ to $C_6$ heteroalkyl group;
$Ar^2$ is selected from substituted $C_{10}$ to $C_{40}$ arylene and/or substituted $C_3$ to $C_{40}$ heteroarylene,
  wherein the $C_{18}$ to $C_{40}$ arylene and/or $C_3$ to $C_{40}$ heteroarylene is substituted with at least one $C_1$ to $C_6$ alkyl and/or $C_1$ to $C_6$ heteroalkyl group;
more preferred $Ar^1$ is selected from substituted $C_6$ to $C_{20}$ arylene and/or substituted $C_3$ to $C_{20}$ heteroarylene,
  wherein the $C_6$ to $C_{20}$ arylene and/or $C_3$ to $C_{20}$ heteroarylene is substituted with at least one $C_1$ to $C_4$ alkyl and/or $C_1$ to $C_4$ heteroalkyl group;
$Ar^2$ is selected from substituted $C_{10}$ to $C_{40}$ arylene and/or substituted $C_3$ to $C_{40}$ heteroarylene,
  wherein the $C_{18}$ to $C_{40}$ arylene and/or $C_3$ to $C_{40}$ heteroarylene is substituted with at least one $C_1$ to $C_4$ alkyl and/or $C_1$ to $C_4$ heteroalkyl group.

According to another aspect, the organic phosphine matrix compound of the at least first electron transport layer may be represented by a compound having the Formula I, wherein $R^1$ and $R^2$ are independently selected from $C_6$ to $C_{20}$ aryl, or $C_5$ to $C_{20}$ heteroaryl.

According to another aspect, the organic phosphine matrix compound of the at least first electron transport layer may be represented by a compound having the Formula I, wherein
$R^1$ and $R^2$ are independently selected from substituted $C_6$ to $C_{20}$ aryl, or substituted $C_5$ to $C_{20}$ heteroaryl,
  wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group, and preferably $R^1$ and $R^2$ is selected the same.

According to another aspect, the organic phosphine matrix compound of the at least first electron transport layer may be represented by a compound having the Formula II, wherein $R^3$ is independently selected from $C_6$ to $C_{20}$ aryl, or $C_3$ to $C_{20}$ heteroaryl.

According to another aspect, the organic phosphine matrix compound of the at least first electron transport layer may be represented by a compound having the Formula II, wherein
$R^3$ is independently selected from substituted $C_6$ to $C_{20}$ aryl, or substituted $C_3$ to $C_{20}$ heteroaryl,
  wherein the $C_6$ to $C_{20}$ aryl, and/or $C_3$ to $C_{20}$ heteroaryl is substituted with at least one $C_1$ to $C_{12}$ alkyl and/or at least one $C_1$ to $C_{12}$ heteroalkyl group.

According to another aspect, the organic phosphine matrix compound of the at least first electron transport layer may be represented by a compound having the Formula III, wherein $R^4$ is independently selected from $C_6$ to $C_{20}$ aryl, or $C_3$ to $C_{20}$ heteroaryl.

According to another aspect, the organic phosphine matrix compound of the at least first electron transport layer may be represented by a compound having the Formula III, wherein
$R^4$ is independently selected from substituted $C_6$ to $C_{20}$ aryl, or substituted $C_3$ to $C_{20}$ heteroaryl,
  wherein the $C_6$ to $C_{20}$ aryl, and/or $C_3$ to $C_{20}$ heteroaryl is substituted with at least one $C_1$ to $C_{12}$ alkyl and/or at least one $C_1$ to $C_{12}$ heteroalkyl group.

According to another aspect, wherein
$R^1$ and $R^2$ are independently selected from substituted $C_6$ to $C_{20}$ aryl, or substituted $C_5$ to $C_{20}$ heteroaryl,
  wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group, and preferably $R^1$ and $R^2$ is selected the same; and/or
$R^3$ is independently selected from substituted $C_6$ to $C_{20}$ arylene, or substituted $C_3$ to $C_{20}$ heteroarylene, wherein the $C_6$ to $C_{20}$ arylene, and/or $C_3$ to $C_{20}$ heteroarylene is substituted with at least one $C_1$ to $C_{12}$ alkyl and/or at least one $C_1$ to $C_{12}$ heteroalkyl group; and/or $R^4$ is independently selected from substituted $C_6$ to $C_{20}$ aryl, or substituted $C_3$ to $C_{20}$ heteroaryl,
wherein the $C_6$ to $C_{20}$ aryl, and/or $C_3$ to $C_{20}$ heteroaryl is substituted with at least one $C_1$ to $C_{12}$ alkyl and/or at least one $C_1$ to $C_{12}$ heteroalkyl group.

According to another aspect, wherein $R^1$ and $R^2$ is independently selected from $C_1$ to $C_4$ alkyl, unsubstituted or substituted $C_6$ to $C_{10}$ aryl, or unsubstituted or substituted $C_5$ to $C_{10}$ heteroaryl,
wherein the $C_6$ to $C_{10}$ aryl, and/or $C_5$ to $C_{10}$ heteroaryl is substituted with at least one $C_1$ to $C_{12}$ alkyl and/or at least one $C_1$ to $C_{12}$ heteroalkyl group, preferably $R^1$ and $R^2$ is selected the same, further preferred $R^1$ and $R^2$ is independently selected from methyl, phenyl, naphthyl, phenanthryl, pyrenyl or pyridyl, in addition preferred $R^1$ and $R^2$ are independently selected from methyl, phenyl and pyridyl; and/or X is O or S, and preferably O; and/or $R^3$ is selected from $C_1$ to $C_6$ alkane-di-yl, unsubstituted or substituted $C_6$ to $C_{10}$ arylene or unsubstituted or substituted $C_5$ to $C_{10}$ heteroarylene, and preferably selected from $C_1$ to $C_4$ alkane-di-yl; and/or $R^4$ is selected from H, phenyl, biphenyl, terphenyl, fluorenyl, naphthyl, anthranyl, phenanthryl, pyrenyl, carbazoyl, dibenzofuranyl, dinapthofuranyl, preferably H, phenyl, biphenyl or naphthyl, and more preferred H; and/or n is 0, 1 or 2, preferably n is 1 or 2, further preferred for n=2 than $Ar^1$ is phenyl, and more preferred for n=1, $R^1$ and $R^2$ are phenyl and $R^4$ is H;

m is 1 or 2 and n is 0 or 1, or m is 2 and n is 2; and/or $Ar^1$ is selected from phenylene, biphenylene, terphenylene, naphthylene, fluorenylene, pyridylene, quinolinylene, and pyrimidinylene; and/or $Ar^2$ is selected from fluorenylene, anthranylene, pyrenylene, phenanthrylene, carbazoylene, benzo[c]acridinylene, dibenzo[c,h]acridinylene, dibenzo[a,j]acridinylene.

According to another aspect, wherein for formula I:
o=2 the organic phosphine matrix compound is a compound having the Formula Ia:

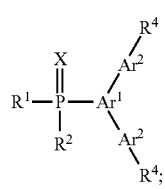

Ia or
o=1 the organic phosphine matrix compound is a compound having the Formula Ib, Ic, Id or Ie:

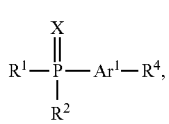

Ib

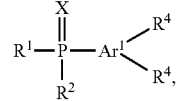

Ic

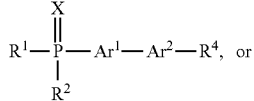

Id

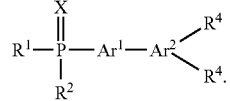

Ie

According to another aspect, wherein for formula I:
o=2 the organic phosphine matrix compound is a compound having the Formula Ia:

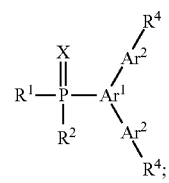

Ia or
o=1 the organic phosphine matrix compound is a compound having the Formula Ib, Ic, Id or Ie:

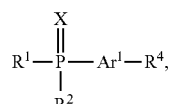

Ib

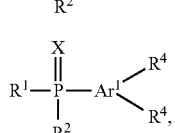

Ic

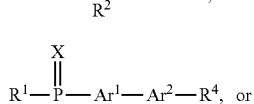

Id

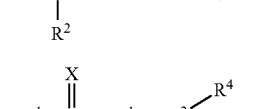

Ie wherein
$R^1$ and $R^2$ is independently selected from $C_1$ to $C_4$ alkyl, unsubstituted or substituted $C_6$ to $C_{10}$ aryl, or unsubstituted or substituted $C_5$ to $C_{10}$ heteroaryl,
wherein the $C_6$ to $C_{10}$ aryl, and/or $C_5$ to $C_{10}$ heteroaryl is substituted with at least one $C_1$ to $C_{12}$ alkyl and/or at least one $C_1$ to $C_{12}$ heteroalkyl group, preferably $R^1$ and $R^2$ is selected the same, further preferred $R^1$ and $R^2$ is independently selected from methyl, phenyl, naphthyl, phenanthryl, pyrenyl or pyridyl, in addition preferred $R^1$ and $R^2$ are independently selected from methyl, phenyl and pyridyl; and/or X is O or S, and preferably O; and/or $R^3$ is selected from $C_1$ to $C_6$ alkane-di-yl, unsubstituted or substituted $C_6$ to $C_{10}$ arylene or unsubstituted or substituted $C_5$ to $C_{10}$ heteroarylene, and preferably selected from $C_1$ to $C_4$ alkane-di-yl; and/or $R^4$ is selected from H, phenyl, biphenyl, terphenyl, fluorenyl, naphthyl, anthranyl, phenanthryl, pyrenyl, carbazoyl, dibenzofuranyl, dinapthofuranyl, preferably H, phenyl, biphenyl or naphthyl, and more preferred H; and/or n is 0, 1 or 2, preferably n is 1 or 2, further preferred for n=2 than $Ar^1$ is phenyl, and more preferred for n=1, $R^1$ and $R^2$ are phenyl and $R^4$ is H;

m is 1 or 2 and n is 0 or 1, or m is 2 and n is 2; and/or $Ar^1$ is selected from phenylene, biphenylene, terphenylene, naphthylene, fluorenylene, pyridylene, quinolinylene, and pyrimidinylene; and/or $Ar^2$ is selected from fluorenylene, anthranylene, pyrenylene, phenanthrylene, carbazoylene, benzo[c]acridinylene, dibenzo[c,h]acridinylene, dibenzo[a,j]acridinylene.

According to another aspect, wherein for formula I:
  o=2 the organic phosphine matrix compound is a compound having the Formula Ia:

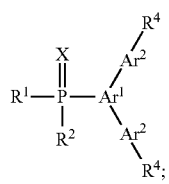

or o=1 the organic phosphine matrix compound is a compound having the Formula Ib, Ic, Id or Ie:

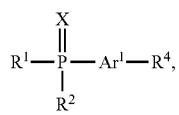

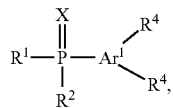

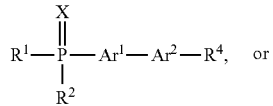

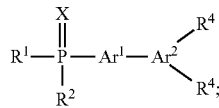

wherein $R^1$ and $R^2$ is independently selected from $C_1$ to $C_4$ alkyl, $C_6$ to $C_{10}$ aryl, or $C_5$ to $C_{10}$ heteroaryl; and/or X is O or S, and preferably O; and/or $R^3$ is selected from $C_1$ to $C_6$ alkane-di-yl, $C_6$ to $C_{10}$ arylene $C_5$ to $C_{10}$ heteroarylene, and preferably selected from $C_1$ to $C_4$ alkane-di-yl; and/or $R^4$ is selected from H, phenyl, biphenyl, terphenyl, fluorenyl, naphthyl, anthranyl, phenanthryl, pyrenyl, carbazoyl, dibenzofuranyl, dinapthofuranyl, preferably H, phenyl, biphenyl or naphthyl, and more preferred H; and/or n is 0, 1 or 2, preferably n is 1 or 2, further preferred for n=2 than $Ar^1$ is phenyl, and more preferred for n=1, $R^1$ and $R^2$ are phenyl and $R^4$ is H;

m is 1 or 2 and n is 0 or 1, or m is 2 and n is 2; and/or $Ar^1$ is selected from phenylene, biphenylene, terphenylene, naphthylene, fluorenylene, pyridylene, quinolinylene, and pyrimidinylene; and/or $Ar^2$ is selected from fluorenylene, anthranylene, pyrenylene, phenanthrylene, carbazoylene, benzo[c]acridinylene, dibenzo[c,h]acridinylene, dibenzo[a,j]acridinylene.

According to another aspect, wherein $R^1$, $R^2$, $R^3$, $R^4$, $Ar^1$ and/or $Ar^2$ are unsubstituted.

According to another aspect, wherein $Ar^2$ is selected from a compound according to Formula IVa to IVh:

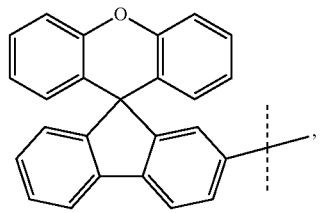

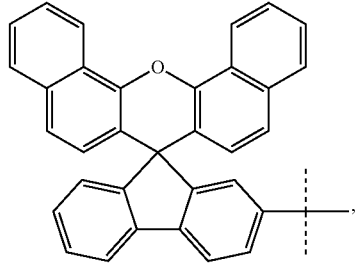

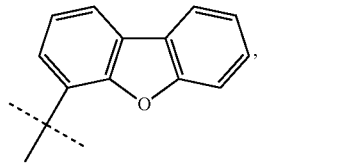

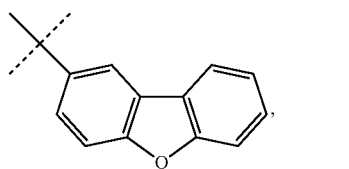

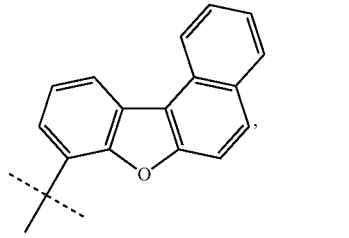

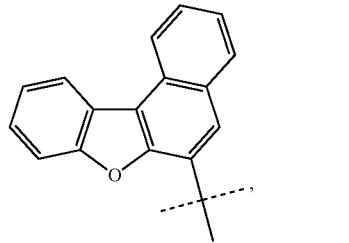

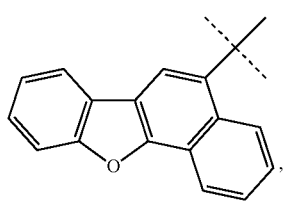
IVg
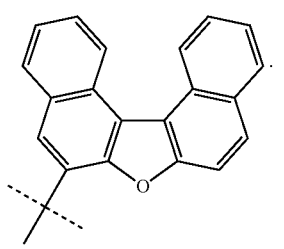
IVh
According to another aspect, wherein the compound of Formula I is selected from a compound according to:
Formula Va to Vz:
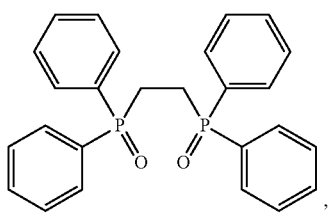
Va
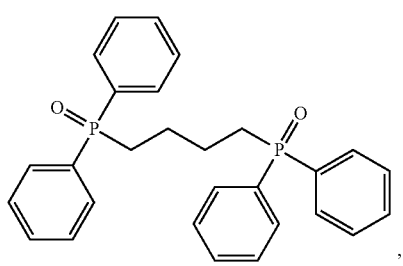
Vb
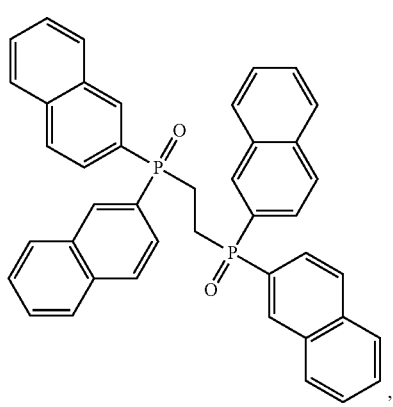
Vc
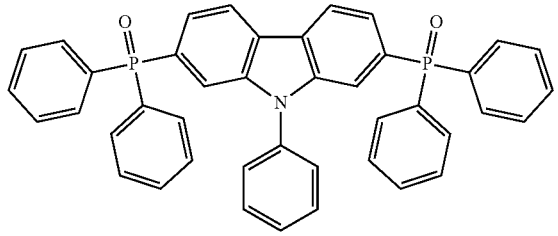
Vd
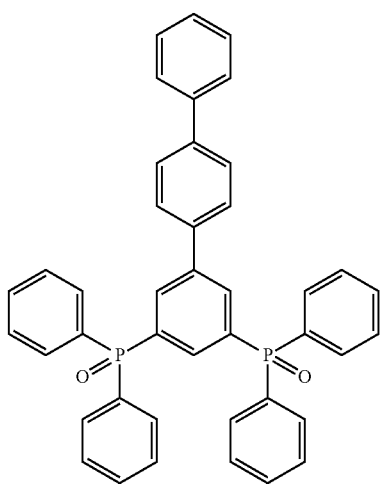
Ve
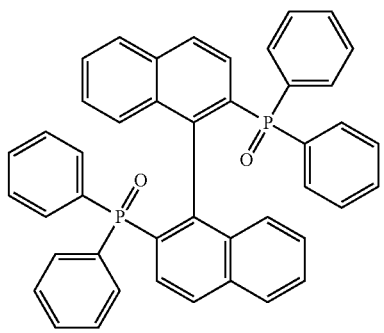
Vf
or
Formula Vg to Vx:
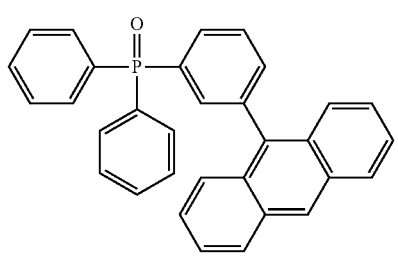
Vg

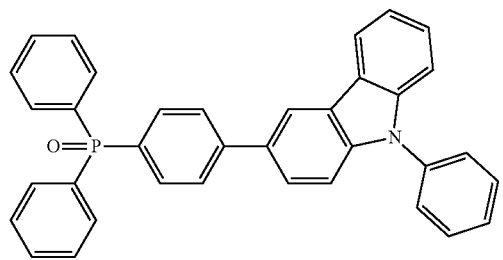
Vh
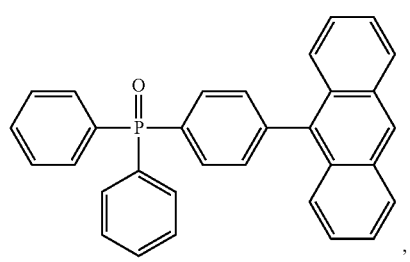
Vi
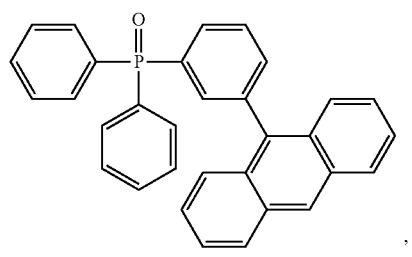
Vj
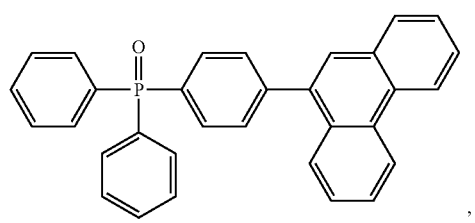
Vk
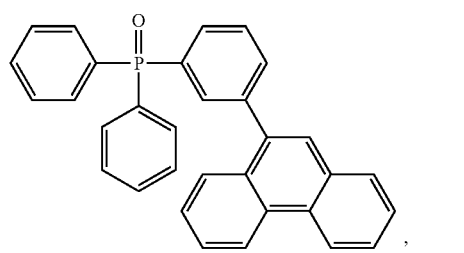
Vl
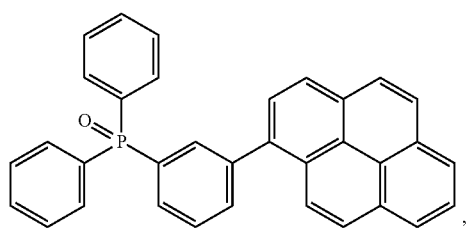
Vm
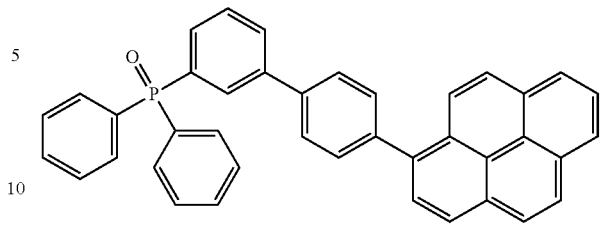
Vn
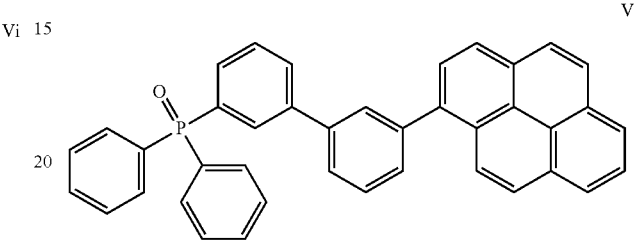
Vo
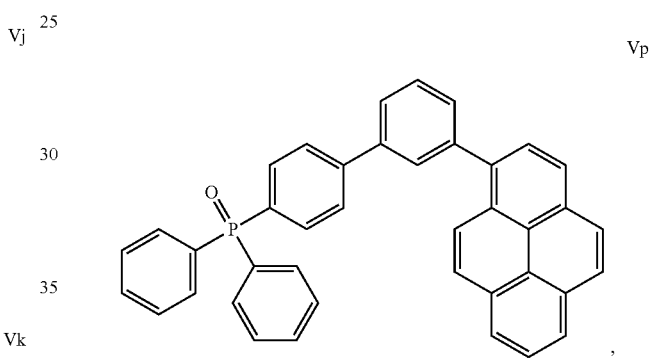
Vp
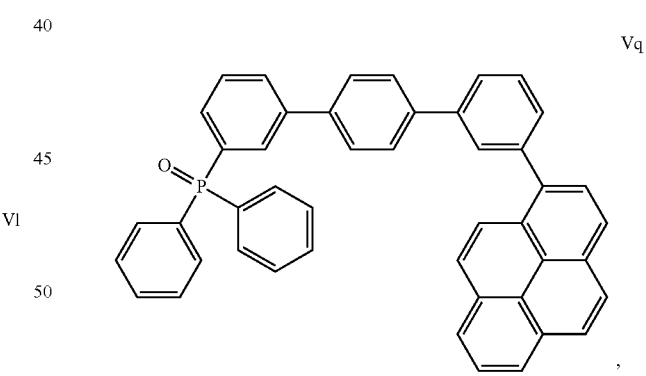
Vq
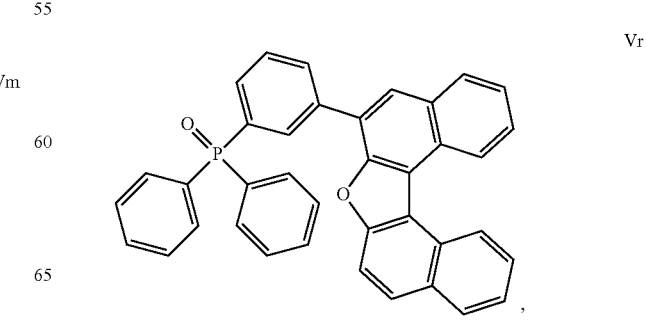
Vr -continued
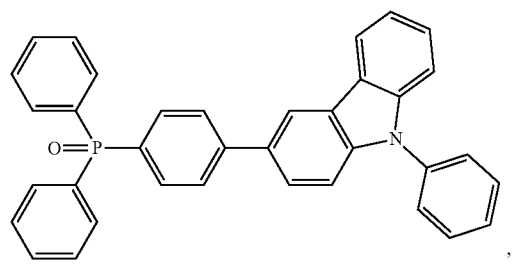
Vs
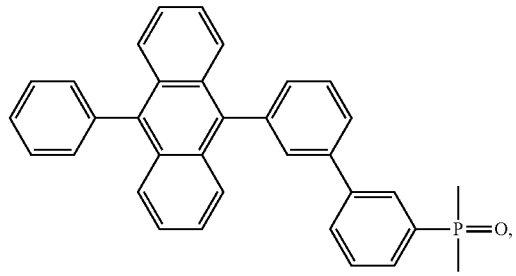
Vw
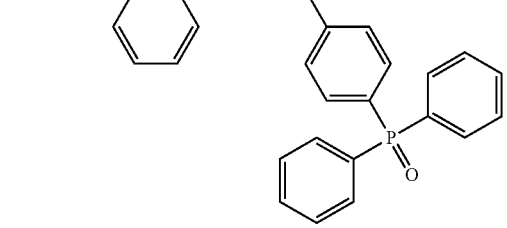
Vt
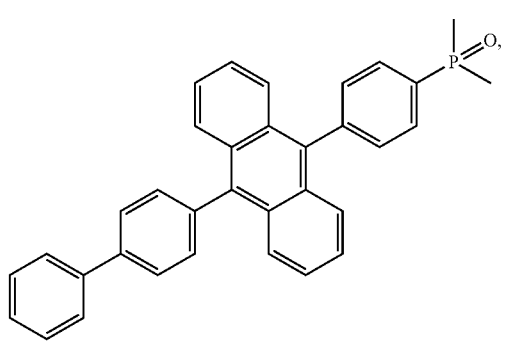
Vx
Formula Vy, Vy1, Vz:
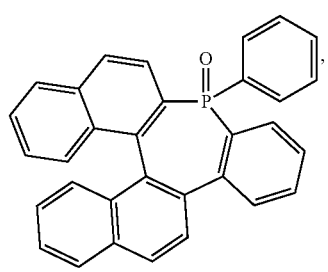
Vu
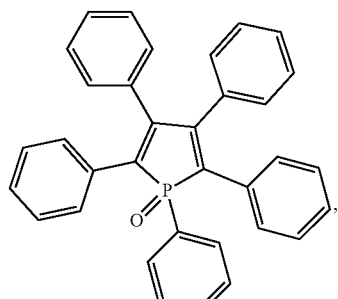
Vy
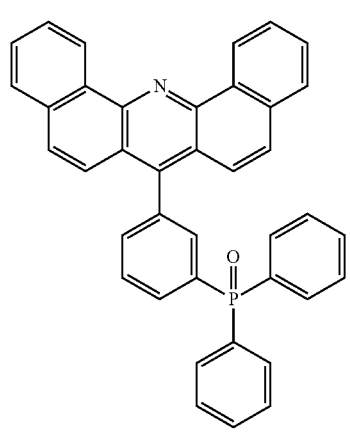
Vv
Vy1
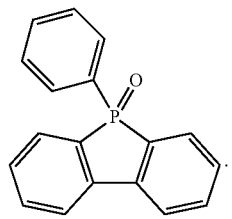
Vz
According to another embodiment, the reduction potential of the compound of Formula I may be selected more negative than −1.9 V and less negative than −2.6 V against Fc/Fc⁺ in tetrahydrofuran, preferably more negative than −2 V and less negative than −2.5 V.

The reduction potential may be determined by cyclic voltammetry with potentiostatic device Metrohm PGSTAT30 and software Metrohm Autolab GPES at room temperature. The redox potentials are measured in an argon de-aerated, anhydrous 0.1M THF solution of the compound of formula 1, under argon atmosphere, with 0.1M tetrabutylammonium hexafluorophosphate as supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run is done in the broadest range of the potential set on the working electrodes, and the range is then adjusted within subsequent runs appropriately. The final three runs are done with the addition of ferrocene (in 0.1M concentration) as the standard. The average of potentials corresponding to cathodic and anodic peak of the compound is determined through subtraction of the average of cathodic and anodic potentials observed for the standard Fc⁺/Fc redox couple.

Particularly good electron injection and/or electron transport into the emission layer and/or stability may be achieved if the reduction potential is selected in this range.

According to another embodiment the compound of formula 1 has a glass transition temperature Tg of about ≥120° C. and about ≤380° C., preferably about ≥130° C. and about ≤350° C., further preferred about ≥150° C. and about ≤320° C.

The glass transition temperature is measured under nitrogen and using a heating rate of 10 K per min in a Mettler Toledo DSC 822e differential scanning calorimeter as described in DIN EN ISO 11357, published in March 2010.

According to another embodiment the compound of Formula I has a rate onset temperature $T_{RO}$ of about ≥180° C. and ≤400° C., preferably about ≥200° C. and about ≤380° C.

Weight loss curves in TGA (thermogravimetric analysis) are measured by means of a Mettler Toledo TGA-DSC 1 system, heating of samples from room temperature to 600° C. with heating rate 10 K/min under a stream of pure nitrogen. 9 to 11 mg sample are placed in a 100 µL Mettler Toledo aluminum pan without lid. The temperature is determined at which 0.5 wt.-% weight loss occurs.

Room temperature, also named ambient temperature, is 23° C., if not otherwise stated.

The rate onset temperature for transfer into the gas phase is determined by loading 100 mg compound into a VTE source. As VTE source a point source for organic materials is used as supplied by Kurt J. Lesker Company (www.lesker.com) or CreaPhys GmbH (http://www.creaphys.com). The VTE (vacuum thermal evaporation) source temperature is determined through a thermocouple in direct contact with the compound in the VTE source. The VTE source is heated at a constant rate of 15 K/min at a pressure of $10^{-7}$ to $10^{-8}$ mbar in the vacuum chamber and the temperature inside the source measured with a thermocouple. Evaporation of the compound is detected with a QCM detector which detects deposition of the compound on the quartz crystal of the detector. The deposition rate on the quartz crystal is measured in Ångstrom per second. To determine the rate onset temperature, the deposition rate on a logarithmic scale is plotted against the VTE source temperature. The rate onset is the temperature at which noticeable deposition on the QCM detector occurs (defined as a rate of 0.02 Å/s. The VTE source is heated and cooled three time and only results from the second and third run are used to determine the rate onset temperature.

The rate onset temperature is an indirect measure of the volatility of a compound. The higher the rate onset temperature the lower is the volatility of a compound.

According to another aspect, the cathode layer of the organic electroluminescent device comprises a first and a second cathode layer.

According to another aspect, the first and second cathode layer of the organic electroluminescent device can be preferably transparent.

According to another aspect, the cathode layer of the organic electroluminescent device comprises Mg, Al, Ag, MgAg alloy, ITO or IZO.

According to another aspect, the organic electroluminescent device may comprise in addition a hole blocking layer.

According to another aspect, the organic electroluminescent device may comprises in addition a hole blocking layer, which comprises a hole blocking matrix compound.

According to another aspect, the organic electroluminescent device may comprises in addition a hole blocking layer, wherein the hole blocking matrix compound can have preferably a dipole moment of about ≥0 and about ≤2.5 Debye.

According to another aspect, the organic electroluminescent device may comprises in addition a hole blocking layer, which is arranged between the emission layer and the first electron transport layer.

According to another aspect, the organic electroluminescent device may comprise in addition a hole blocking layer.

According to another aspect, the organic electroluminescent device comprises in addition a hole blocking layer comprising a hole blocking matrix compound, which is arranged between the emission layer and the first electron transport layer, preferably the dipole moment of the hole blocking matrix compound is about ≥0 and about ≤2.5 Debye.

According to another aspect, the organic electroluminescent device may comprise in addition a second electron transport layer comprising a second electron transport matrix compound.

According to another aspect, the organic electroluminescent device may comprises in addition a second electron transport layer comprising a second electron transport matrix compound, wherein the second electron transport layer differs in its components from the components of the first electron transport layer.

According to another aspect, the organic electroluminescent device may comprises in addition a second electron transport layer, which is arranged between the emission layer or hole blocking layer, if present, and the first electron transport layer.

According to another aspect, the organic electroluminescent device may comprises in addition a second electron transport layer, wherein the dipole moment of the second electron transport matrix compound can be about ≥0 and about ≤2.5 Debye.

Surprisingly, it was found that the electron injection layer and the first electron transport layer of the organic electroluminescent device solve the problem underlying the present invention by being superior over the organic electroluminescent devices, in particular with respect to the conductivity and operating voltage. Increased conductivity and reduced operating voltage are important for low power consumption and increased battery life, for example in a mobile display device.

The inventors have surprisingly found that particular good performance can be achieved when using the organic electroluminescent device as a fluorescent blue device.

The specific arrangements mentioned herein as preferred were found to be particularly advantageous.

Further an organic optoelectronic device having high efficiency and/or long life-span may be realized.

Hereinafter, a compound for an organic optoelectronic device according to an embodiment is described.

Anode

A material for the anode may be a metal or a metal oxide, or an organic material, preferably a material with work function above about 4.8 eV, more preferably above about 5.1 eV, most preferably above about 5.3 eV. Preferred metals are noble metals like Pt, Au or Ag, preferred metal oxides are transparent metal oxides like ITO or IZO which may be advantageously used in bottom-emitting OLEDs having a reflective cathode.

In devices comprising a transparent metal oxide anode or a reflective metal anode, the anode may have a thickness from about 50 nm to about 100 nm, whereas semitransparent metal anodes may be as thin as from about 5 nm to about 15 nm.

Hole Injection Layer

The hole injection layer may improve interface properties between the anode and an organic material used for the hole transport layer, and is applied on a non-planarized anode and thus may planarize the surface of the anode. For example, the hole injection layer may include a material having a median value of the energy level of its highest occupied molecular orbital (HOMO) between the work function of the anode material and the energy level of the HOMO of the hole transport layer, in order to adjust a difference between the work function of the anode and the energy level of the HOMO of the hole transport layer.

When the hole transport region comprises a hole injection layer 36, the hole injection layer may be formed on the anode by any of a variety of methods, for example, vacuum deposition, spin coating, casting, Langmuir-Blodgett (LB) method, or the like.

When hole injection layer is formed using vacuum deposition, vacuum deposition conditions may vary depending on the material that is used to form the hole injection layer, and the desired structure and thermal properties of the hole injection layer to be formed and for example, vacuum deposition may be performed at a temperature of about 100° C. to about 500° C., a pressure of about $10^{-6}$ Pa to about $10^{-1}$ Pa, and a deposition rate of about 0.1 to about 10 nm/sec, but the deposition conditions are not limited thereto.

When the hole injection layer is formed using spin coating, the coating conditions may vary depending on the material that is used to form the hole injection layer, and the desired structure and thermal properties of the hole injection layer to be formed. For example, the coating rate may be in the range of about 2000 rpm to about 5000 rpm, and a temperature at which heat treatment is performed to remove a solvent after coating may be in a range of about 80° C. to about 200° C., but the coating conditions are not limited thereto.

The hole injection layer may further comprise a p-dopant to improve conductivity and/or hole injection from the anode.

p-Dopant

In another aspect, the p-dopant may be homogeneously dispersed in the hole injection layer.

In another aspect, the p-dopant may be present in the hole injection layer in a higher concentration closer to the anode and in a lower concentration closer to the cathode.

The p-dopant may be one of a quinone derivative, a radialene compound. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ).

Hole Transport Layer

Conditions for forming the hole transport layer and the electron blocking layer may be defined based on the above-described formation conditions for the hole injection layer.

A thickness of the hole transport part of the charge transport region may be from about 10 nm to about 1000 nm, for example, about 10 nm to about 100 nm. When the hole transport part of the charge transport region comprises the hole injection layer and the hole transport layer, a thickness of the hole injection layer may be from about 10 nm to about 1000 nm, for example about 10 nm to about 100 nm and a thickness of the hole transport layer may be from about 5 nm to about 200 nm, for example about 10 nm to about 150 nm. When the thicknesses of the hole transport part of the charge transport region, the HIL, and the HTL are within these ranges, satisfactory hole transport characteristics may be obtained without a substantial increase in operating voltage.

Hole transport matrix materials used in the hole transport region are not particularly limited. Preferred are covalent compounds comprising a conjugated system of at least 6 delocalized electrons, preferably organic compounds comprising at least one aromatic ring, more preferably organic compounds comprising at least two aromatic rings, even more preferably organic compounds comprising at least three aromatic rings, most preferably organic compounds comprising at least four aromatic rings. Typical examples of hole transport matrix materials which are widely used in hole transport layers are polycyclic aromatic hydrocarbons, triarylene amine compounds and heterocyclic aromatic compounds. Suitable ranges of frontier orbital energy levels of hole transport matrices useful in various layer of the hole transport region are well-known. In terms of the redox potential of the redox couple HTL matrix/cation radical of the HTL matrix, the preferred values (if measured for example by cyclic voltammetry against ferrocene/ferrocenium redox couple as reference) may be in the range 0.0-1.0 V, more preferably in the range 0.2-0.7 V, even more preferably in the range 0.3-0.5 V.

Buffer Layer

The hole transport part of the charge transport region may further include a buffer layer.

Buffer layer that can be suitable used are disclosed in U.S. Pat. Nos. 6,140,763, 6,614,176 and in US2016/248022.

The buffer layer may compensate for an optical resonance distance of light according to a wavelength of the light emitted from the EML, and thus may increase efficiency.

Emission Layer

The emission layer (EML) may be formed on the hole transport region by using vacuum deposition, spin coating, casting, LB method, or the like. When the emission layer is formed using vacuum deposition or spin coating, the conditions for deposition and coating may be similar to those for the formation of the hole injection layer, though the conditions for the deposition and coating may vary depending on the material that is used to form the emission layer. The emission layer may include an emitter host (EML host) and an emitter dopant (further only emitter).

Emitter Host

According to another embodiment, the emission layer comprises compound of formula 1 as emitter host.

The emitter host compound has at least three aromatic rings, which are independently selected from carbocyclic rings and heterocyclic rings.

Other compounds that can be used as the emitter host is an anthracene matrix compound represented by formula 400 below:

Formula 400

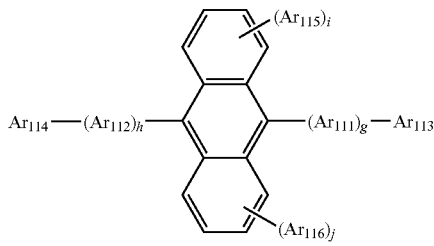

In formula 400, $Ar_{111}$ and $Ar_{111}$ may be each independently a substituted or unsubstituted $C_6$-$C_{60}$ arylene group; $Ar_{113}$ to $A_{116}$ may be each independently a substituted or unsubstituted $C_1$-$C_{10}$ alkyl group or a substituted or unsubstituted $C_6$-$C_{60}$ arylene group; and g, h, i, and j may be each independently an integer from 0 to 4.

In some embodiments, $Ar_{111}$ and $Ar_{112}$ in formula 400 may be each independently one of a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one of a phenyl group, a naphthyl group, or an anthryl group.

In formula 400, g, h, i, and j may be each independently an integer of 0, 1, or 2.

In formula 400, $Ar_{113}$ to $Ar_{116}$ may be each independently one of a $C_1$-$C_{10}$ alkyl group substituted with at least one of a phenyl group, a naphthyl group, or an anthryl group;

a phenyl group, a naphthyl group, an anthryl group, a pyrenyl group, a phenanthrenyl group, or a fluorenyl group;

a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group

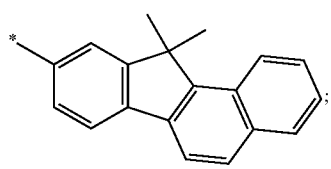 [SMILES: Cc1ccc2c(c1)C(C)(C)c1c-2ccc2ccccc12]

or formulas 3 or 4

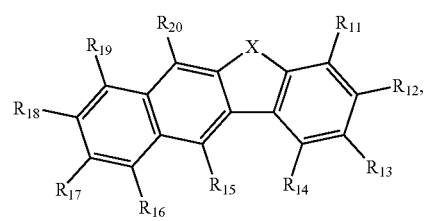

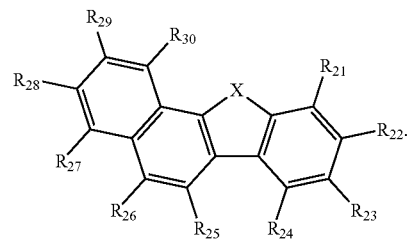

Wherein in the formulas 3 and 4, X is selected form an oxygen atom and a sulfur atom, but embodiments of the invention are not limited thereto.

In the formula 3, any one of $R_{11}$ to $R_{14}$ is used for bonding to $Ar_{111}$. $R_{11}$ to $R_{14}$ that are not used for bonding to $Ar_{111}$ and $R_{15}$ to $R_{20}$ are the same as $R_1$ to $R_8$.

In the formula 4, any one of $R_{21}$ to $R_{24}$ is used for bonding to $Ar_{111}$. $R_{21}$ to $R_{24}$ that are not used for bonding to $Ar_{111}$ and $R_{25}$ to $R_{30}$ are the same as $R_1$ to $R_8$.

Preferably, the EML host comprises between one and three heteroatoms selected from the group consisting of N, O or S. More preferred the EML host comprises one heteroatom selected from S or O.

The emitter host compound may have a dipole moment in the range from about $\geq 0$ Debye to about $\leq 2.0$ Debye.

Preferably, the dipole moment of the EML host is selected $\geq 0.2$ Debye and $\leq 1.45$ Debye, preferably $\geq 0.4$ Debye and $\leq 1.2$ Debye, also preferred $\geq 0.6$ Debye and $\leq 1.1$ Debye.

The dipole moment is calculated using the optimized using the hybrid functional B3LYP with the 6-31G* basis set as implemented in the program package TURBOMOLE V6.5. If more than one conformation is viable, the conformation with the lowest total energy is selected to determine the dipole moment of the molecules. Using this method, 2410-phenyl-9-anthracenyl)-benzo[b]naphtho[2,3-d]furan (CAS 1627916-48-6) has a dipole moment of 0.88 Debye, 2-(6-(10-phenylanthracen-9-yenaphthalen-2-yl)dibenzo[b,d]thiophene (CAS 1838604-62-8) of 0.89 Debye, 2-(6-(10-phenylanthracen-9-yl)naphthalen-2-yl)dibenzo[b,d]furan (CAS 1842354-89-5) of 0.69 Debye, 2-(7-(phenanthren-9-yl)tetraphen-12-yl)dibenzo[b,d]furan (CAS 1965338-95-7) of 0.64 Debye, 4-(4-(7-(naphthalen-1-yl)tetraphen-12-yl) phenyl) dibenzo[b,d] furan (CAS 1965338-96-8) of 1.01 Debye.

Emitter Dopant

The dopant is mixed in a small amount to cause light emission, and may be generally a material such as a metal complex that emits light by multiple excitation into a triplet or more. The dopant may be, for example an inorganic, organic, or organic/inorganic compound, and one or more kinds thereof may be used.

The emitter may be a red, green, or blue emitter.

The dopant may be a fluorescent dopant, for example ter-fluorene, the structures are shown below. 4.4'-bis(4-diphenyl amiostyryl)biphenyl (DPAVBI, 2,5,8,11-tetra-tertbutyl perylene (TBPe), and Compound 5 below are examples of fluorescent blue dopants.

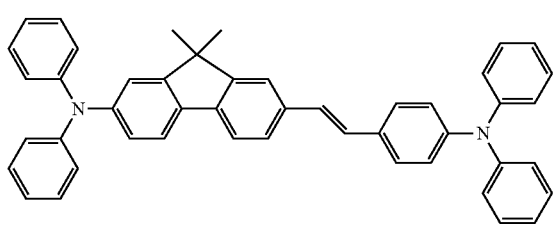

Compound 5

The dopant may be a phosphorescent dopant, and examples of the phosphorescent dopant may be an organic metal compound comprising Ir, Pt, Os, Ti, Zr, Hf, Eu, Tb, Tm, Fe, Co, Ni, Ru, Rh, Pd, or a combination thereof. The phosphorescent dopant may be, for example a compound represented by formula Z, but is not limited thereto:

$$J2MX \quad (Z).$$

In formula Z, M is a metal, and J and X are the same or different, and are a ligand to form a complex compound with M.

The M may be, for example Ir, Pt, Os, Ti, Zr, Hf, Eu, Tb, Tm, Fe, Co, Ni, Ru, Rh, Pd or a combination thereof, and the J and X may be, for example a bidendate ligand.

Electron Transport Layer

According to another embodiment, the electron transport layer/s, preferably the first electron transport layer comprises a first zero-valent alkali metal and an organic phosphine matrix compound of a compound of formula I, or preferably of at least one compound of formulae Va to Vz.

In another embodiment, the organic electroluminescent device comprises an electron transport region of a stack of organic layers formed by two or more electron transport layers, wherein at least one electron transport layer, preferably the first electron transport layer, comprises a first zero-valent alkali metal and an organic phosphine matrix compound of a compound of formula I, or preferably of at least one compound of formulae Va to Vz.

The electron transport layer may include one or two or more different electron transport compounds.

According to one embodiment the organic electroluminescent device may comprises at least one electron transport layer (ETL).

According to another embodiment the organic electroluminescent device may comprises at least two electron transport layers (ETL), of a first electron transport layer and a second electron transport layer.

According to another embodiment the organic electroluminescent device may comprises at least two electron transport layers (ETL), of a first electron transport layer and a second electron transport layer, wherein at least one component of the first electron transport layer differs from the components of the second electron transport layer.

According to another embodiment the organic electroluminescent device may comprises at least three electron transport layers (ETL), of a first electron transport layer, a second electron transport layer and a third electron transport layer.

According to another embodiment the organic electroluminescent device may comprises at least three electron transport layers (ETL), of a first electron transport layer, a second electron transport layer and a third electron transport layer, wherein at least one component of the first electron transport layer differs from the components of the second electron transport layer and/or third electron transport layer.

According to another embodiment the organic electroluminescent device may comprises at least three electron transport layers (ETL), of a first electron transport layer, a second electron transport layer and a third electron transport layer, wherein the components of the first electron transport layer, the second electron transport layer and the third electron transport are different.

According to another embodiment the organic electroluminescent device may comprises at least three electron transport layers (ETL), of a first electron transport layer, a second electron transport layer and a third electron transport layer, wherein the first electron transport layer, and the third electron transport comprises the same components and the second electron transport layer differs from the first and third in at least one component.

According to another embodiment, the second electron transport layer comprises at least one organic phosphine matrix compound, preferably a compound of formula I and the first electron transport layer comprises an organic phosphine matrix compound, which is selected different to the organic phosphine matrix compound of the second electron transport layer.

According to another embodiment, the first electron transport layer comprises at least one organic phosphine matrix compound selected from the group:
an anthracene based compound or a hetero substituted anthracene based compound, preferably 2-(4-(9,10-di(naphthalen-2-yeanthracene-2-yl)phenyl)-1-phenyl-1H-benzo[d]imidazole and/or N4,N4"-di(naphthalen-1-yl)-N4,N4"-diphenyl-[1,1':4',1"-terphenyl]-4,4"-diamine.

According to another embodiment, the second electron transport layer comprises at least one organic phosphine matrix compound selected from the group:
an anthracene based compound or a hetero substituted anthracene based compound, preferably 2-(4-(9,10-di(naphthalen-2-yeanthracene-2-yl)phenyl)-1-phenyl-1H-benzo[d]imidazole and/or N4,N4"-di(naphthalen-1-yl)-N4,N4"-diphenyl-[1,1':4',1"-terphenyl]-4,4"-diamine.

According to another embodiment, the first electron transport layer comprises at least one compound of formula I according to the invention and the optional second electron transport layer comprises a matrix compound, which is selected different to the compound of formula I according to the invention, and may be selected from:
a substituted phenanthroline compound, preferably 2,4,7,9-tetraphenyl-1,10-phenanthroline or 2,9-di(biphenyl-4-yl)-4,7-diphenyl-1,10-phenanthroline
a substituted triazine compound,
a substituted acridine compound,
a substituted anthracene compound.

The thickness of the first electron transport layer may be from about 0.5 nm to about 100 nm, for example about 2 nm to about 30 nm. When the thickness of the first electron transport layer is within these ranges, the first electron transport layer may have improved electron transport ability without a substantial increase in operating voltage.

A thickness of the optional second electron transport layer may be about 1 nm to about 100 nm, for example about 2 nm to about 20 nm. When the thickness of the electron transport layer is within these ranges, the electron transport layer may have satisfactory electron transporting ability without a substantial increase in operating voltage.

The first electron transport layer may further comprise alkali organic complex.

According to another embodiment, the first and second electron transport layers comprise a compound of formula I, wherein the second electron transport layer further comprises an alkali halide and/or alkali organic complex.

Alkali Halide

Alkali halides, also known as alkali metal halides, are the family of inorganic compounds with the chemical formula MX, where M is an alkali metal and X is a halogen.

M can be selected from Li, Na, Potassium, Rubidium and Cesium.

X can be selected from F, Cl, Br and J.

According to various embodiments a potassium or rubidium halide may be preferred. The potassium or rubidium halide can be selected from the group comprising KF, KCl, KBr, KI, RbF, RbCl, RbBr, and RbI. Most preferred are KI and RbI.

The alkali halide is essentially non-emissive or non-emissive.

Alkali Organic Complex

According to another aspect, the first electron transport layer may comprises in addition an alkali organic complex, which is not an organic phosphine matrix compound, preferably the alkali organic complex is a lithium organic complex.

According to various embodiments the organic ligand of the alkali organic complex, preferably of a lithium organic complex, is a quinolate, a borate, a phenolate, a pyridinolate or a Schiff base ligand.

According to another aspect, the first electron transport layer may comprise in addition:

an alkali halide, preferably a Lithium halide; and/or an alkali organic complex, preferably the organic ligand of the alkali organic complex is quinolate, a borate, a phenolate, a pyridinolate or a Schiff base ligand, preferably the borate based organic ligand is a tetra(1H-pyrazol-1-yl)borate;

preferably the phenolate is a 2-(pyridin-2-yl)phenolate, a 2-diphenylphosphoryl)phenolate, an imidazol phenolates, or 2-(pyridin-2-yl)phenolate and more preferred 2-(1-phenyl-1H-benzo[d]imidazol-2-yl)phenolate;

preferably the pyridinolate is a 2-(diphenylphosphoryl)pyridin-3-olate, preferably the lithium Schiff base has the structure 100, 101, 102 or 103:

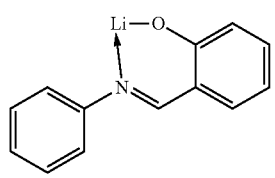
100

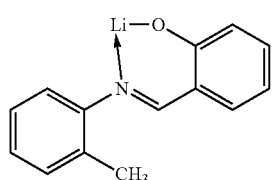
101

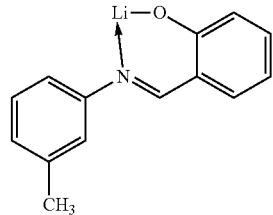
102

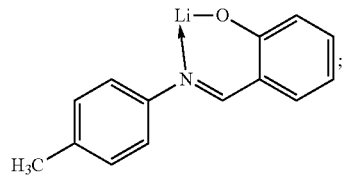
103 and more preferred the alkali organic complex is a Lithium complex that has the formula I, II, III or IV:

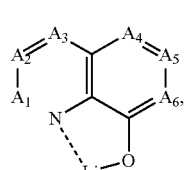
(I)

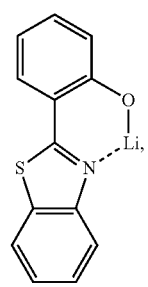
(II)

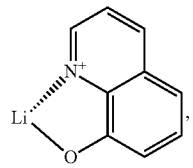
(III)

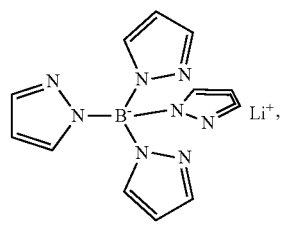
(IV)

wherein $A_1$ to $A_6$ are same or independently selected from CH, CR, N, O;

R is same or independently selected from hydrogen, halogen, alkyl or aryl or heteroaryl with 1 to 20 carbon atoms; and more preferred $A_1$ to $A_6$ are CH.

According to another aspect, wherein the first electron transport layer comprises in addition a lithium organic complex, wherein the organic complex is selected from the group of quinolate, borate, phenolate, pyridinolate or Schiff base ligand.

Quinolates that can be suitable used are disclosed in WO 2013079217 A1 and incorporated by reference.

According to another aspect, the organic ligand of the lithium organic complex can be a borate based organic ligand, Preferably the lithium organic complex is a lithium tetra(1H-pyrazol-1-yl)borate. Borate based organic ligands that can be suitable used are disclosed in WO 2013079676 A1 and incorporated by reference.

According to another aspect, the organic ligand of the lithium organic complex can be a phenolate ligand, Preferably the lithium organic complex is a lithium 2-(diphenylphosphoryl)phenolate. Phenolate ligands that can be suitable used are disclosed in WO 2013079678 A1 and incorporated by reference.

Further, phenolate ligands can be selected from the group of pyridinolate, preferably 2-(diphenylphosphoryl)pyridin-3-olate. Pyridine phenolate ligands that can be suitable used are disclosed in JP 2008195623 and incorporated by reference.

In addition, phenolate ligands can be selected from the group of imidazol phenolates, preferably 2-(1-phenyl-1H-benzo[d]imidazol-2-yl)phenolate. Imidazol phenolate ligands that can be suitable used are disclosed in JP 2001291593 and incorporated by reference.

Also, phenolate ligands can be selected from the group of oxazol phenolates, preferably 2-(benzo[d]oxazol-2-yl)phenolate. Oxazol phenolate ligands that can be suitable used are disclosed in US 20030165711 and incorporated by reference.

The alkali organic complex may be essentially non-emissive or non-emissive.

Electron Injection Layer

The organic electroluminescent device comprises an electron injection layer (EIL) between the first electron transport layer (first-ETL) and the cathode.

The electron injection layer (EIL) may facilitate injection of electrons from the cathode.

According to another aspect, the electron injection layer (EIL) may be in direct contact with the cathode.

According to another aspect, the electron injection layer (EIL) is contacting sandwiched between the first electron transport layer and the cathode.

According to another aspect, the electron injection layer may comprises a mixture of
 a second zero-valent metal, which is an alkaline earth metal and/or rare earth metal, and
 an alkali metal halide.

According to another aspect, the second zero-valent metal, which is an alkaline earth metal and/or rare earth metal, may be selected from the group comprising Mg, Ca, Sr, Ba, Yb, Sm, Eu, Nd, Tb, Gd, Ce, La.

According to another aspect, the second zero-valent metal, which is an alkaline earth metal and/or rare earth metal, may be more preferred selected from the group comprising Mg, Ca, Ba, Yb, Sm or Eu.

According to another aspect of the invention, the electron injection layer comprises:
(i) an second zero-valent metal, which is an electropositive metal selected from alkaline earth metals and/or rare earth metals, preferably selected from Mg, Ca, Sr, Ba, Yb, Sm, Eu, Nd, Tb, Gd, Ce, La, and more preferred from Mg, Ca, Ba, Yb, Sm or Eu; and/or
(ii) an alkali metal halide, preferably a K or Rb halide, more preferred at least one selected from KI or RbI.

According to another aspect, the electron injection layer may comprise a gradient distribution of the alkali metal halide.

According to another aspect, the electron injection layer may comprises a gradient distribution of the alkali metal halide, wherein it can be preferred that the concentration of the alkali metal halide in the electron injection layer increases in the direction to the electron transport layer.

According to another aspect, the electron injection layer may comprises a gradient distribution of the alkali metal halide, wherein it can be preferred that the concentration of the alkali metal halide in the electron injection layer decreases in the direction to the electron transport layer.

According to another aspect, the electron injection layer may comprise a homogenous mixture of a second zero-valent metal of an alkaline earth metal and/or rare earth metal and of an alkali halide.

According to another aspect, the electron injection layer may comprise a first and second electron injection layer, wherein the first electron injection layer is arranged closer to the anode and the second electron injection layer is arranged closer to the cathode, and the first and second electron injection layer are arranged in direct contact.

According to another aspect, the electron injection layer may consist of a first and second electron injection layer, wherein the first electron injection layer is arranged closer to the anode and the second electron injection layer is arranged closer to the cathode, and the first and second electron injection layer are arranged in direct contact.

According to another aspect, the first electron injection layer comprises an alkali halide and the second electron injection layer comprises a second zero-valent metal of an alkaline earth metal and/or rare earth metal.

According to another aspect, the first electron injection layer comprises a second zero-valent metal of an alkaline earth metal and/or rare earth metal and the second electron injection layer comprises an alkali metal halide.

According to another aspect, the first electron injection layer comprises 10 to 98 vol.-% second zero-valent metal of an alkaline earth metal and/or rare earth metal and 2 to 90 vol.-% alkali halide, wherein the vol.-% is based on the total vol.-% of the first electron injection layer.

A thickness of the EIL or EIL layer may be from about 0.1 nm to about 10 nm, or about 0.3 nm to about 9 nm. When the thickness of the electron injection layer is within these ranges, the electron injection layer may have satisfactory electron injection ability without a substantial increase in operating voltage.

According to one embodiment the organic electroluminescent device may comprises at least one electron injection layer (EIL).

According to another embodiment the organic electroluminescent device may comprises at least two electron injection layers (EIL), of a first electron injection layer and a second electron injection layer.

According to another embodiment the organic electroluminescent device may comprises at least two electron injection layers (EIL), of a first electron injection layer and a second electron transport layer, wherein at least one component of the first electron injection layer differs from the components of the second electron injection layer.

According to another embodiment the organic electroluminescent device may comprises at least two electron injection layers (EIL), of a first electron injection layer and a second electron transport layer, wherein the first electron injection layer comprises a second zero-valent metal of an alkaline earth metal and/or rare earth metal, and an alkali metal halide; and the second electron injection layer differs from the first electron injection layer in at least one component.

According to another embodiment the organic electroluminescent device may comprises at least two electron injection layers (EIL), of a first electron injection layer and a second electron transport layer, wherein the second electron injection layer comprises a second zero-valent metal of an alkaline earth metal and/or rare earth metal, and an alkali metal halide; and the first electron injection layer differs from the second electron injection layer in at least one component.

According to another embodiment the organic electroluminescent device may comprises at least two electron injection layers (EIL), of a first electron injection layer and a second electron transport layer, wherein the first electron injection layer and the second electron injection layer comprises a second zero-valent metal of an alkaline earth metal and/or rare earth metal, and an alkali metal halide.

According to another embodiment the organic electroluminescent device may comprises at least two electron injection layers (EIL), of a first electron injection layer and a second electron transport layer, wherein the first electron injection layer and the second electron injection layer comprises a second zero-valent metal of an alkaline earth metal and/or rare earth metal, and an alkali metal halide; wherein the first electron injection layer and the second electron injection layer are identical.

After forming at least two electron injection layers (EIL), due to the fact that the electron injection layers (EIL) are very thin, the at least two electron injection layers (EIL) may appear after formation as a single layer caused by migration effects and/or may appear in reverse engineering as a single layer. In particular, if the at least two electron injection layers (EIL) are identical, after formation thereof, the at least two electron injection layers (EIL) may appear after formation as a single layer caused by migration effects and/or may appear in reverse engineering as a single layer.

According to another embodiment the first electron injection layer (EIL) may comprises Yb, Yb and KI, Yb and RbI, KI.

According to another embodiment the second electron injection layer (EIL) may comprises Yb or KI.

According to another embodiment the organic electroluminescent device may comprises at least two electron injection layers (EIL), of a first electron injection layer and a second electron transport layer, wherein the first electron injection layer and the second electron injection layer are identical or different.

According to another embodiment, the electron injection layer (EIL) may be essentially non-emissive or non-emissive.

According to another embodiment, the electron injection layer (EIL) may be:
essentially non-emissive or non-emissive, and/or
free of covalently bound metal.

Cathode

A material for the cathode may be a metal, an alloy, or an electrically conductive compound that have a low work function, or a combination thereof. Specific examples of the material for the cathode may be lithium (Li), magnesium (Mg), aluminum (Al), aluminum-lithium (Al—Li), calcium (Ca), magnesium-indium (Mg—In), magnesium-silver (Mg—Ag), etc. In order to manufacture a top-emission light-emitting device having a reflective anode deposited on a substrate, the cathode may be formed as a light-transmissive electrode from, for example, indium tin oxide (ITO) or indium zinc oxide (IZO).

In devices comprising a transparent metal oxide cathode or a reflective metal cathode, the cathode may have a thickness from about 50 nm to about 100 nm, whereas semitransparent metal cathodes may be as thin as from about 5 nm to about 15 nm.

Organic Electroluminescent Device

The organic electroluminescent device may include an anode layer, at least one first electron transport layer comprising an organic phosphine matrix compound, and a first zero-valent alkali metal, an electron injection layer comprising a second zero-valent metal of an alkaline earth metal and/or rare earth metal and an alkali metal halide, an cathode layer, and an emission layer, wherein the emission layer is arranged between the anode layer and the cathode layer, wherein the at least a first electron transport layer and the electron injection layer are arranged between the emission layer and the cathode layer, wherein the electron injection layer is arranged in direct contact to the first transport electron layer, wherein the first electron transport layer is arranged nearer to the anode layer and the electron injection layer is arranged nearer to the cathode layer.

According to another embodiment the organic electroluminescent device may include a substrate, an anode layer, at least one first electron transport layer comprising a compound of formula I and a first zero-valent alkali metal, an electron injection layer comprising a second zero-valent metal of an alkaline earth metal and/or rare earth metal and an alkali metal halide, an cathode layer, and an emission layer, wherein the emission layer is arranged between the anode layer and the cathode layer, wherein the at least a first electron transport layer and the electron injection layer are arranged between the emission layer and the cathode layer, wherein the electron injection layer is arranged in direct contact to the first transport electron layer, wherein the first electron transport layer is arranged nearer to the anode layer and the electron injection layer is arranged nearer to the cathode layer.

The organic electroluminescent device according to the invention can be an organic light-emitting diode (OLED) that may comprises an anode, a hole transport layer (HTL), an emission layer (EML), a first electron transport layer (ETL) comprising an organic phosphine matrix compound, and a first zero-valent alkali metal, preferably at least one compound of formula I, an electron injection layer (EIL) comprising a second zero-valent metal of an alkaline earth metal and/or rare earth metal and an alkali metal halide, and a cathode, which are sequentially stacked on a substrate. In this regard, the HTL, the EML, ETL and the EIL are thin films formed from organic compounds, optionally comprising metals and/or compounds comprising ionically or covalently bound metal.

According to one embodiment the OLED may have the following layer structure, wherein the layers having the following order:

an anode layer, a hole injection layer, optional an first hole transport layer, optional a second hole transport layer, optional an electron blocking layer, an emission layer, optional a hole blocking layer, a first electron transport layer, an electron injection layer, and a cathode layer.

Method of Manufacturing an Organic Electroluminescent Device

According to another aspect, there is provided a method of manufacturing an organic electroluminescent device, the method using:

at least one deposition source, preferably two deposition sources and more preferred at least three deposition sources.

The methods for deposition that can be suitable comprise:
deposition via vacuum thermal evaporation (VTE);
deposition via solution processing, preferably the processing is selected from spin-coating, printing, casting; and/or
slot-die coating.

According to various embodiments, there is provided a method of manufacture of at least a first electron transport layer and an electron injection layer of an organic electroluminescent device comprising the steps of:
forming a first electron transport layer, comprising an organic phosphine matrix compound; and
forming an electron injection layer, comprising an alkali metal halide and a second zero-valent metal, which is a rare earth metal and/or alkaline earth metal, directly onto the first electron transport layer;
wherein the second zero-valent metal, which is a rare earth metal and/or alkaline earth metal reduces the alkali halide to a first zero-valent alkali metal and the obtained first zero-valent alkali metal diffuses into the organic phosphine matrix compound of the first electron transport layer.

The advantage of forming a first electron transport layer comprising or consisting of an organic phosphine matrix compound, preferably an organic phosphine matrix compound according to formula I, and forming thereon an electron injection layer, comprising an alkali metal halide and a second zero-valent metal, which is a rare earth metal and/or alkaline earth metal, directly onto the first electron transport layer, is that the second zero-valent metal, which is a rare earth metal and/or alkaline earth metal reduces the alkali halide to a first zero-valent alkali metal and the obtained first zero-valent alkali metal diffuses into the organic phosphine matrix compound of the first electron transport layer, which facilitates the manufacture of electron transport layers comprising an alkali metal.

Higher throughput and improved reproducibility may be achieved, because the electron transport layer can be deposited by sequentially depositing the organic phosphine matrix compound in a first deposition chamber using a lower temperature VTE source, and the alkali halide and zero-valent metal of an alkaline earth metal and/or rare earth metal in a second deposition chamber, using a higher temperature VTE source. Thereby, a step of depositing the organic phosphine matrix compound and alkali metal at the same time in the same deposition chamber is avoided. This is important for mass production, as the deposition of organic phosphine matrix compounds and alkali metals at the same time is difficult to control.

According to various embodiments, there is provided a method using:
a first deposition source to release the organic phosphine matrix compound for forming the first electron transport layer, and
a second deposition source to release the alkali metal halide and a third deposition source to release a second zero-valent metal, which is a rare earth metal and/or alkaline earth metal, directly onto the first electron transport layer for forming an electron injection layer directly on the electron transport layer;
wherein the second zero-valent metal, which is a rare earth metal and/or alkaline earth metal reduces the alkali halide in the electron injection layer to a first zero-valent alkali metal and the obtained first zero-valent alkali metal diffuses into the organic phosphine matrix compound of the first electron transport layer.

According to various embodiments, there is provided a method using:
a first deposition source to release the organic phosphine matrix compound of formula I for forming the first electron transport layer, and
a second deposition source to release the alkali metal halide and a third deposition source to release a second zero-valent metal, which is a rare earth metal and/or alkaline earth metal, directly onto the first electron transport layer for forming an electron injection layer directly on the electron transport layer;
wherein the second zero-valent metal, which is a rare earth metal and/or alkaline earth metal reduces the alkali halide in the electron injection layer to a first zero-valent alkali metal and the obtained first zero-valent alkali metal diffuses into the organic phosphine matrix compound of the first electron transport layer.

According to various embodiments, there is provided a method using:
a first deposition source arranged in a first deposition chamber to release the organic phosphine matrix compound for forming the first electron transport layer, and
a second deposition source in a second deposition chamber to release the alkali metal halide and a third deposition source in the second deposition chamber to release a second zero-valent metal, which is a rare earth metal and/or alkaline earth metal, directly onto the first electron transport layer for forming an electron injection layer directly on the electron transport layer;
wherein the second zero-valent metal, which is a rare earth metal and/or alkaline earth metal reduces the alkali halide in the electron injection layer to a first zero-valent alkali metal and the obtained first zero-valent alkali metal diffuses into the organic phosphine matrix compound of the first electron transport layer.

According to various embodiments, the method may further include forming on the anode electrode an emission layer and at least one layer selected from the group consisting of forming a hole injection layer, forming a hole transport layer, forming an electron blocking layer, or forming a hole blocking layer, between the anode electrode and the first electron transport layer.

According to various embodiments, the method may further include the steps for forming an organic electroluminescent device, preferably an organic light-emitting diode (OLED), wherein
on a substrate a first anode electrode is formed,
on the first anode electrode an emission layer is formed,
on the emission layer an electron transport layer is formed, preferably the first electron transport layer is formed on the emission layer,
an electron injection layer is formed directly on the first electron transport layer,
and finally a cathode electrode is formed thereon,
optional a hole injection layer, a hole transport layer, and a hole blocking layer, formed in that order between the first anode electrode and the emission layer.

According to various embodiments, the organic electroluminescent device, preferably OLED, may have the following layer structure, wherein the layers having the following order:
an anode, first hole transport layer, second hole transport layer, emission layer, optional second electron transport layer, first electron transport layer, an electron injection layer or an interlayer comprising an electron injection layer, and a cathode.

According to another aspect of the invention, it is provided an electronic device comprising at least one organic electroluminescent device according to any embodiment described throughout this application, preferably the electronic device comprises the organic electroluminescent device, preferably the organic light emitting diode, in one of the embodiments described throughout this application. More preferably, the electronic device is a display device.

According to various embodiments, the electronic device can be a display device, a light emitting device, a thin film transistor, a battery or a photovoltaic cell, and preferably a light emitting diode.

Hereinafter, the embodiments are illustrated in more detail with reference to examples. However, the present disclosure is not limited to the following examples.

DESCRIPTION OF THE DRAWINGS

These and/or other aspects and advantages will become apparent and more readily appreciated from the following description of the exemplary embodiments, taken in conjunction with the accompanying drawings, of which.

Figure 1:
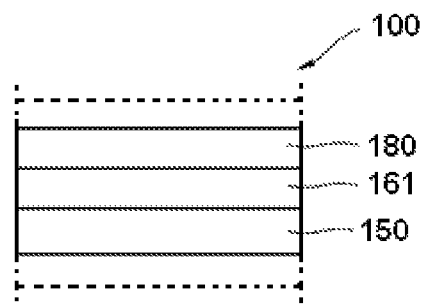
FIG. 1 is a schematic sectional view of an organic light-emitting diode (OLED), according to an exemplary embodiment of the present invention with an emission layer, a first electron transport layer and an electron injection layer.

Reference will now be made in detail to the exemplary aspects, examples of which are illustrated in the accompanying drawings, wherein like reference numerals refer to the like elements throughout. The exemplary embodiments are described below, in order to explain the aspects, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

The term "contacting sandwiched" refers to an arrangement of three layers whereby the layer in the middle is in direct contact with the two adjacent layers.

The organic light emitting diodes according to an embodiment may include an anode layer, at least one first electron transport layer, an electron injection layer, a cathode layer, and an emission layer.

FIG. 1 is a schematic sectional view of an organic light-emitting diode 100, according to an exemplary embodiment. The OLED 100 comprises an emission layer 150, an electron transport layer (ETL) 161 and an electron injection layer 180, whereby the first electron transport layer 161 is disposed directly on the emission layer 150 and the electron injection layer 180 is disposed directly on the first electron transport layer 161.

Figure 2:
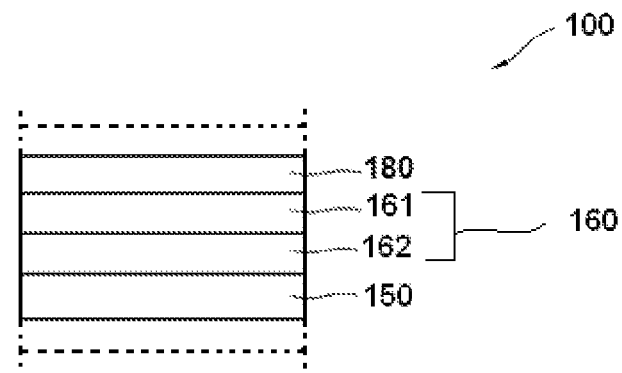
FIG. 2 is a schematic sectional view of an organic light-emitting diode (OLED), according to an exemplary embodiment of the present invention with an emission layer, two electron transport layers and a first electron injection layer.

FIG. 2 is a schematic sectional view of an organic light-emitting diode 100, according to an exemplary embodiment. The OLED 100 comprises an electron injection layer 180, an emission layer 150 and an electron transport layer stack (ETL) 160 comprising a first electron transport layer 161 and a second electron transport layer 162, whereby the second electron transport layer 162 is disposed directly on the emission layer 150. Thus, the first electron transport layer (ETL) 161 is in direct contact with the electron injection layer (EIL) 180. The second electron transport layer (ETL) 162 is arranged between the first electron transport layer (ETL) 161 and the emission layer (EML) 150.

Figure 3:
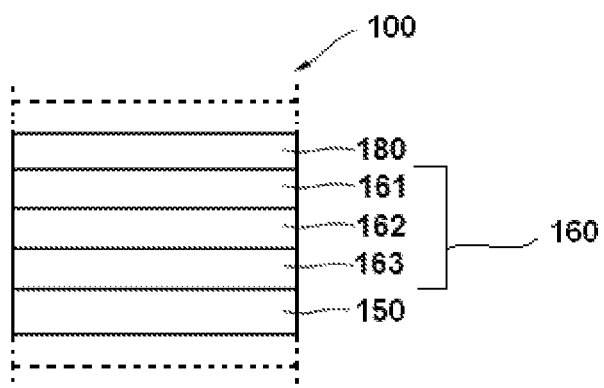
FIG. 3 is a schematic sectional view of an OLED, according to an exemplary embodiment of the present invention with an emission layer and three electron transport layers.

FIG. 3 is a schematic sectional view of an organic light-emitting diode 100, according to an exemplary embodiment. The OLED 100 comprises an emission layer (EML) 150, an electron injection layer (EIL) 180 and an electron transport layer stack (ETL) 160 comprising a first electron transport layer (ETL) 161, a second electron transport layer (ETL) 162, and a third electron transport layer (ETL) 163, whereby the second electron transport layer (ETL) 162 is disposed directly on the first electron transport layer (ETL) 161 and the third electron transport layer (ETL) 163 is disposed directly on the second electron transport layer (ETL) 162. Thus, the first electron transport layer (ETL) 161 is in direct contact with the electron injection layer (EIL) 180. The second electron transport layer (ETL) 162 is arranged between the first electron transport layer (ETL) 161 and the third electron transport layer (ETL) 163. The third electron transport layer (ETL) 163 is arranged between the second electron transport layer (ETL) 162 and the emission layer (EML) 150.

Figure 4:
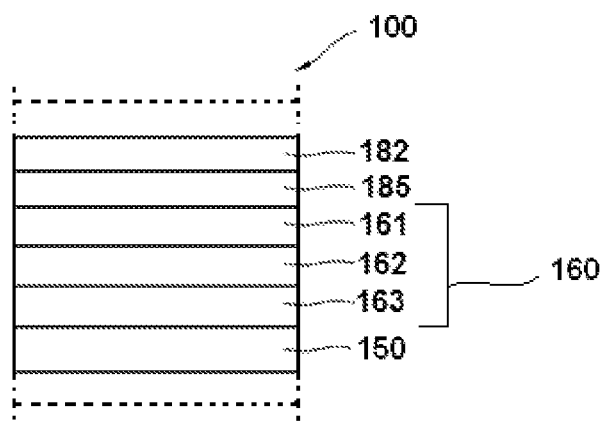
FIG. 4 is a schematic sectional view of an OLED, according to an exemplary embodiment of the present invention with an emission layer, two electron injection layers and three electron transport layers.

FIG. 4 is a schematic sectional view of an organic light-emitting diode 100, according to an exemplary embodiment. The OLED 100 comprises an emission layer (EML) 150, a first electron injection layer (EIL) 182 and a second electron injection layer (EIL) 185, and an electron transport layer stack (ETL) 160 comprising a first electron transport layer (ETL) 161, a second electron transport layer (ETL) 162, and a third electron transport layer (ETL) 163, whereby the second electron transport layer 162 (ETL) is disposed directly on the first electron transport layer (ETL) 161 and the third electron transport layer (ETL) 163 is disposed directly on the second electron transport layer (ETL) 162. The first electron transport layer (ETL) 161 is in direct contact with the second electron injection layer (EIL) 185. The second electron injection layer (EIL) 185 is arranged between the first electron injection layer (EIL) 182 and the first electron transport layer (ETL) 161. The second electron transport layer (ETL) 162 is arranged between the first electron transport layer (ETL) 161 and the third electron transport layer (ETL) 163, and the third electron transport layer (ETL) 163 is arranged between the second electron transport layer (ETL) 162 and the emission layer (EML) 150.

Figure 5:
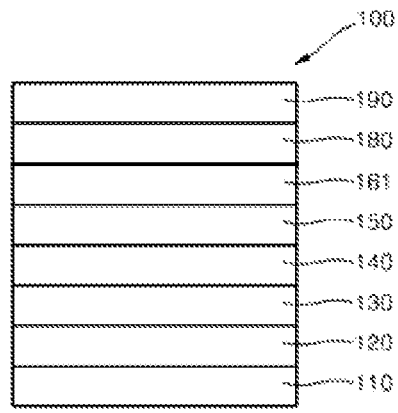
FIG. 5 is a schematic sectional view of an organic light-emitting diode (OLED), according to an exemplary embodiment of the present invention with an emission layer, an electron injection layer and one electron transport layer.

FIG. 5 is a schematic sectional view of an organic light-emitting diode 100, according to an exemplary embodiment. The OLED 100 comprises a substrate 110, an anode electrode 120, a hole injection layer (HIL) 130, a hole transport layer (HTL) 140, an emission layer (EML) 150, one first electron transport layer (ETL) 161, an electron injection layer (EIL) 180, and a cathode electrode 190. The first electron transport layer (ETL) 161 comprises a compound of formula I and a first zero-valent alkali metal. The second electron transport layer (ETL) 162 is formed directly on the EML 150.

Figure 6:
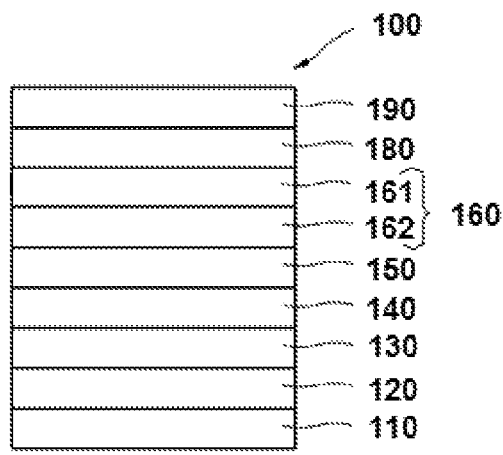
FIG. 6 is a schematic sectional view of an organic light-emitting diode (OLED), according to an exemplary embodiment of the present invention with an emission layer, electron injection layer and two electron transport layers.

FIG. 6 is a schematic sectional view of an organic light-emitting diode 100, according to an exemplary embodiment. The OLED 100 comprises a substrate 110, an anode electrode 120, a hole injection layer (HIL) 130, a hole transport layer (HTL) 140, an emission layer (EML) 150, an electron transport layer stack (ETL) 160 of a first electron transport layer (ETL) 161 and a second electron transport layer (ETL) 162, an electron injection layer (EIL) 180, and a cathode electrode 190. The second electron transport layer (ETL) 162 is arranged nearer to the anode (120) and the first electron transport layer (ETL) 161 is arranged nearer to the cathode (190). The first electron transport layer comprises a compound of formula I and a first zero-valent alkali metal.

Figure 7:
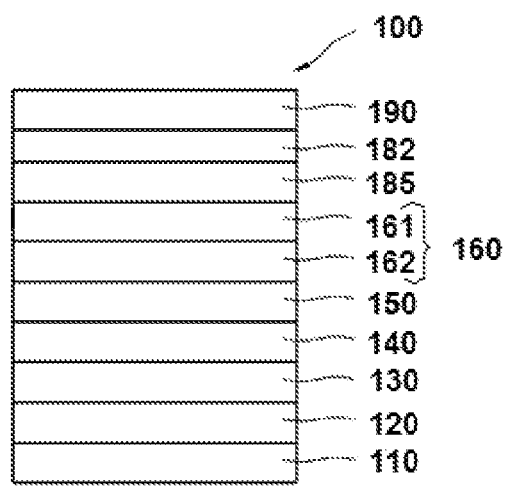
FIG. 7 is a schematic sectional view of an OLED, according to an exemplary embodiment of the present invention with an emission layer, two electron injection layer and two electron transport layers.

FIG. 7 is a schematic sectional view of an organic light-emitting diode 100, according to an exemplary embodiment. The OLED 100 comprises a substrate 110, an anode electrode 120, a hole injection layer (HIL) 130, a hole transport layer (HTL) 140, an emission layer (EML) 150, an electron transport layer stack (ETL) 160, a first electron injection layer (EIL) 182, a second electron injection layer (EIL) 185 and a cathode electrode 190. The electron transport layer stack (ETL) 160 comprises a first electron transport layer (ETL) 161 and a second electron transport layer (ETL) 162. The second electron transport layer (ETL) 162 is formed directly on the emission layer (EML) 150. The first electron transport layer (ETL) 162 comprises a compound of formula I and a first zero-valent alkali metal.

A substrate may be further disposed under the anode 120 or on the cathode 190. The substrate may be a substrate that is used in a general organic light emitting diode and may be a glass substrate or a transparent plastic substrate with strong mechanical strength, thermal stability, transparency, surface smoothness, ease of handling, and water resistance.

The hole injection layer 130 may improve interface properties between ITO as an anode and an organic material used for the hole transport layer 140, and may be applied on a non-planarized ITO and thus may planarize the surface of the ITO. For example, the hole injection layer 130 may include a material having particularly desirable conductivity between a work function of ITO and HOMO of the hole transport layer 140, which are a second zero-valent metal of an alkaline earth metal and/or rare earth metal, and an alkali metal halide, in order to adjust a difference in work function of ITO as an anode and HOMO of the hole transport layer 140.

When the hole transport region comprises a hole injection layer 130, the hole injection layer may be formed on the anode 120 by any of a variety of methods, for example, vacuum deposition, spin coating, casting, Langmuir-Blodgett (LB) method, or the like.

When hole injection layer is formed using vacuum deposition, vacuum deposition conditions may vary depending on the material that is used to form the hole injection layer, and the desired structure and thermal properties of the hole injection layer to be formed and for example, vacuum deposition may be performed at a temperature of about 100° C. to about 500° C., a pressure of about $10^{-8}$ torr to about $10^{-3}$ torr, and a deposition rate of about 0.01 to about 100 Å/sec, but the deposition conditions are not limited thereto.

When the hole injection layer is formed using spin coating, the coating conditions may vary depending on the material that is used to form the hole injection layer, and the desired structure and thermal properties of the hole injection layer to be formed. For example, the coating rate may be in the range of about 2000 rpm to about 5000 rpm, and a temperature at which heat treatment is performed to remove a solvent after coating may be in a range of about 80° C. to about 200° C., but the coating conditions are not limited thereto.

Conditions for forming the hole transport layer and the electron blocking layer may be defined based on the above-described formation conditions for the hole injection layer.

A thickness of the hole transport region may be from about 100 Å to about 10000 Å, for example, about 100 Å to about 1000 Å. When the hole transport region comprises the hole injection layer and the hole transport layer, a thickness of the hole injection layer may be from about 100 Å to about 10,000 Å, for example about 100 Å to about 1000 Å and a thickness of the hole transport layer may be from about 50 Å to about 2,000 Å, for example about 100 Å to about 1500 Å. When the thicknesses of the hole transport region, the HIL, and the HTL are within these ranges, satisfactory hole transport characteristics may be obtained without a substantial increase in operating voltage.

A thickness of the emission layer may be about 100 Å to about 1000 Å, for example about 200 Å to about 600 Å. When the thickness of the emission layer is within these ranges, the emission layer may have improved emission characteristics without a substantial increase in an operating voltage.

Next, an electron transport region is disposed on the emission layer.

The electron transport region may include at least one of a second electron transport layer, a first electron transport layer, and an electron injection layer.

The thickness of the electron transport layer may be from about 20 Å to about 1000 Å, for example about 30 Å to about 300 Å. When the thickness of the electron transport layer is within these ranges, the electron transport layer may have improved electron transport auxiliary ability without a substantial increase in operating voltage.

A thickness of the electron transport layer may be about 100 Å to about 1000 Å, for example about 150 Å to about 500 Å. When the thickness of the electron transport layer is within these ranges, the electron transport layer may have satisfactory electron transporting ability without a substantial increase in operating voltage.

In addition, the electron transport region may include an electron injection layer (EIL) that may facilitate injection of electrons from the anode.

A thickness of the EIL may be from about 1 Å to about 100 Å, or about 3 Å to about 90 Å. When the thickness of the electron injection layer is within these ranges, the electron injection layer may have satisfactory electron injection ability without a substantial increase in operating voltage.

The anode can be disposed on the organic layer. A material for the anode may be a metal, an alloy, or an electrically conductive compound that have a low work function, or a combination thereof. Specific examples of the material for the anode 150 may be lithium (Li, magnesium (Mg), aluminum (Al), aluminum-lithium (Al—Li), calcium (Ca), magnesium-indium (Mg—In), magnesium-silver (Mg—Ag), etc. In order to manufacture a top-emission light-emitting device, the anode 150 may be formed as a light-transmissive electrode from, for example, indium tin oxide ITO) or indium zinc oxide IZO).

According to another aspect of the invention, a method of manufacturing an organic electroluminescent device is provided, wherein
- on an anode electrode (120) the other layers of hole injection layer (130), hole transport layer (140), optional an electron blocking layer, an emission layer (150), optional second electron transport layer (162), first electron transport layer (161), electron injection layer (180), and a cathode (190), are deposited in that order; or
- the layers are deposited the other way around, starting with the cathode (190).

According to another aspect of the invention, a method of manufacturing an organic electroluminescent device is provided, wherein
- on an anode electrode (120) the other layers of hole injection layer (130), hole transport layer (140), optional an electron blocking layer, an emission layer (150), optional second electron transport layer (162), first electron transport layer (161), a second electron injection layer (182), a first electron injection layer (185), and a cathode (190), are deposited in that order; or
- the layers are deposited the other way around, starting with the cathode (190).

Hereinafter, the embodiments are illustrated in more detail with reference to examples. However, the present disclosure is not limited to the following examples.

General Procedure for Fabrication of Organic Electroluminescent Devices

OLEDs were prepared to demonstrate the technical benefit utilizing the organic phosphine compounds, preferably compounds of formula I, in an electron transport layer of an organic electroluminescent device.

The organic phosphine compounds may be synthesized as described in WO2013079217A1, WO2015052284A1, WO2016162440A1, EP15195877.4 and EP16164871.2.

Top Emission Devices

For top emission devices—Examples 1 to 18 and comparative examples 1 to 3, glass was cut to a size of 50 mm×50 mm×0.7 mm, ultrasonically cleaned with isopropyl alcohol for 5 minutes and then with pure water for 5 minutes, and cleaned again with UV ozone for 30 minutes. The anode electrode is formed on the glass by depositing 100 nm silver in ultra-high vacuum of $10^{-7}$ mbar at a rate of 0.01 to 1 Å/s.

Then, 92 vol.-% of biphenyl-4-yl(9,9-diphenyl-9H-fluoren-2-yl)-[4-(9-phenyl-9H-carbazol-3-yl)phenyl]-amine (CAS 1242056-42-3) and 8 vol.-% of 2,2',2"-(cyclopropane-1,2,3-triylidene)tris(2-(p-cyanotetrafluorophenyl)acetonitrile) is vacuum deposited on the anode, to form a HIL having a thickness of 10 nm. Then biphenyl-4-yl(9,9-diphenyl-9H-fluoren-2-yl)-[4-(9-phenyl-9H-carbazol-3-yl)phenyl]-amine is vacuum deposited on the HIL, to form a HTL having a thickness of 121 nm. Then N,N-bis(4-(dibenzo[b,d]furan-4-yl)phenyl)-[1,1':4',1"-terphenyl]-4-amine is deposed directly on top of the HTL to form an EBL with a thickness of 5 nm.

97 vol.-% of 2-(10-phenyl-9-anthracenyl)-benzo[b]naphtho[2,3-d]furan as a host and 3 vol.-% of blue emitter dopant described in WO2015-174682 are deposited on the EBL, to form a blue-emitting EML with a thickness of 20 nm.

Then, a hole blocking layer is formed by depositing 6 nm 2,4-diphenyl-6-(4',5',6'-triphenyl-[1,1':2',1":3",1''':3'''',1''''-quinquephenyl]-3''''-yl)-1,3,5-triazine (CAS 2032364-64-8, WO 2016171358) directly onto the emission layer.

Then, the first electron transport layer is formed by deposing the first electron transport matrix compound according to examples 1 to 11 and comparative examples 1 to 2 directly onto the hole blocking layer.

The first electron transport layer may further comprise an alkali organic complex, see examples 12 to 18. In this case, the first matrix compound is deposed from a first deposition source and the alkali organic complex from a second deposition source directly on the hole blocking layer. The composition and thickness of the first electron transport layer can be taken from Table 1 to 3.

Then, the electron injection layer is deposed on the first electron transport layer by deposing the halide of the first metal from a first deposition source and the second metal from a second deposition source directly on the first electron transport layer. The composition and thickness can be taken from Tables 1 to 3.

Then, the cathode layer is evaporated at ultra-high vacuum of $10^{-7}$ mbar. Therefore, a thermal single co-evaporation of one or several metals is performed with a rate of 0, 1 to 10 nm/s (0.01 to 1 Å/s) in order to generate a homogeneous cathode electrode with a thickness of 5 to 1000 nm. The cathode layer is formed by deposing 12 nm Mg:Ag (15:85 vol.-%) directly onto the electron injection layer.

Then 60 nm biphenyl-4-yl(9,9-diphenyl-9H-fluoren-2-yl)-[4-(9-phenyl-9H-carbazol-3-yl)phenyl]-amine is deposed directly onto the cathode layer.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 10 mA/cm² for bottom emission and 10 mA/cm² for top emission devices, a calibrated spectrometer CAS140 from Instrument Systems is used for measurement of CIE coordinates and brightness in Candela. Lifetime LT of bottom emission device is measured at ambient conditions (20° C.) and 10 mA/cm², using a Keithley 2400 sourcemeter, and recorded in hours. In bottom emission devices, the emission is predominately Lambertian and quantified in percent external quantum efficiency (EQE). To determine the efficiency EQE in % the light output of the device is measured using a calibrated photodiode at 10 mA/cm2.

In top emission devices, the emission is forward directed, non-Lambertian and also highly dependent on the microcavity. Therefore, the efficiency EQE will be higher compared to bottom emission devices. To determine the efficiency EQE in % the light output of the device is measured using a calibrated photodiode at 10 mA/cm2.

Technical Effect of the Invention

In Table 1 are shown results for top emission OLEDs wherein the electron injection layer has different compositions. The first electron transport layer is formed from 31 nm organic phosphine compound Vu.

In comparative example 1, the electron injection layer comprises 1.3 nm KI. The operating voltage is 6 V and the cd/A efficiency is 5 cd/A and the EQE efficiency is 8.8%.

In comparative example 2, the electron injection layer comprises 1.3 nm Yb. The operating voltage is very high at ≥5 V, therefore the efficiency has not been measured.

In example 1, the electron injection layer comprises a physical mixture of Yb and KI with a thickness of 2 nm. The operating voltage is reduced significantly to 3.8 V. The cd/A efficiency is 4.7 cd/A and the EQE efficiency is improved to 9.2%.

In example 2, the electron injection layer comprises Yb and RbI with a thickness of 2 nm. The operating voltage is low at 3.7 V and the efficiency is improved further to 6.4 cd/A and 12.6% EQE.

In example 3, the electron injection layer comprises Eu and KI with a thickness of 2 nm. The operating voltage is low at 4.3 V and the efficiency is 4.7 cd/A and 9.2% EQE.

In example 4, the electron injection layer comprises Ba and KI with a thickness of 2 nm. The operating voltage is low at 4.5 V and the efficiency is 4.5 cd/A and 8.8% EQE.

In Table 2 results are shown for various matrix compounds in the first electron transport layer.

In comparative example 3, the first electron transport layer comprises Alq3. The operating voltage is 7.3 V and the efficiency is 3.7 cd/A and 6.1% EQE.

In Example 5, an organic phosphine compound Vy is used. The operating voltage is reduced significantly to 4.1 V and the efficiency is significantly improved to 5.9 cd/A and 11.6% EQE.

In examples 6 and 8, two more organic phosphine compounds are used, and the operating voltage is reduced even further to 3.6 and 3.35 V, resp. The efficiency is improved even further to 6.3 cd/A and 12.9% EQE for organic phosphine compound Vu and to 7.3 cd/A and 14.7% EQE for organic phosphine compound Vv.

In example 7 and 10, the electron injection layer comprises a first electron injection layer, formed from KI, in direct contact with the first electron transport layer and a second electron injection layer, formed from Yb, is in direct contact with the first electron injection layer. The operating voltage is very low and the efficiency is high.

In Example 9, this thickness of the first electron transport layer is increased from 1.8 to 3 nm. The operating voltage is still low at 3.4 V and the efficiency remains high at 6.5 cd/A and 13.3% EQE.

In example 11, the electron injection layer comprises a first electron injection layer, formed from Yb, in direct contact with the first electron transport layer; and a second electron injection layer, formed from KI, in direct contact with the first electron injection layer. The operating voltage is low and the efficiency is high.

In summary, low operating voltage and high efficiency can be achieved independent of the composition of the electron injection layer in direct contact with the first electron transport layer, as long as one electron injection layer comprises a second zero-valent metal of an alkaline earth metal and/or rare earth metal and the other electron injection layer comprises of alkali metal halide.

In Table 3 results are shown for a first electron transport layer further comprising an alkali organic complex.

In example 12, the triazine compound is replaced by organic phosphine compound Vv. The operating voltage is improved substantially to 3.5 V. The efficiency is improved further at 7.9 cd/A and 16.3% EQE.

In example 13, organic phosphine compound Vu is used. The operating voltage is 3.5V and the efficiency is 7.8 cd/A and 16.8% EQE.

In example 14, alkali organic complex Li-1 (lithium tetra(1H-pyrazol-1-yl)borate) is used instead of LiQ. The operating voltage is reduced further to 3.2 V and the efficiency stays high at 7.5 cd/A and 16.2% EQE.

In example 15, KI is replaced by RbI. The operating voltage is still low at 3.5 V and the efficiency is high at 6.3 cd/A and 13.2% EQE.

In example 16, 17 and 18 the effect of the electron injection layer on the operating voltage and efficiency is tested. The composition of the first electron transport layer remains the same.

In example 16, the electron injection layer comprises a physical mixture of Yb and KI. The operating voltage is 3.15 V and the efficiency is 8.8 cd/A and 16.1% EQE.

In example 17, the first electron injection layer comprises KI and the second electron injection layer comprises Yb. The first electron injection layer is in direct contact with the first electron transport layer. The second electron injection layer is in direct contact with the first electron injection layer. The operating voltage is 3.2 V and efficiency high at 8.6 cd/A and 15.6% EQE.

In example 18, the first electron injection layer comprises Yb and the second electron injection layer comprises KI. The layers are arranged as described for example 10. The operating voltage is 3.2 V and the efficiency is 8.8 cd/A and 15.8% EQE.

In summary, the benefit of low operating voltage and high efficiency is observed even when the first electron transport layer comprises an alkali organic complex.

TABLE 1

Electron injection layer comprising various alkali metal halides and zero-valent alkaline earth and rare earth metals

| | First electron matrix compound | Thickness ETL1/nm | Composition of electron injection layer | Composition of electron injection layer (vol.-%) | Thickness electron injection layer (nm) | Operating voltage at 10 mA/cm$^2$ (V) | cd/A efficiency at 10 mA/cm$^2$ (cd/A) | EQE efficiency at 10 mA/cm$^2$ (%) |
|---|---|---|---|---|---|---|---|---|
| Comparative example 1 | Vu | 31 | KI | 100 | 1.3 | 6 | 5 | 8.8 |
| Comperative example 2 | Vu | 31 | Yb | 100 | 1.3 | >5 | — | — |
| Example 1 | Vu | 31 | Yb:KI | 51.5:48.5 | 2.0 | 3.8 | 4.7 | 9.2 |
| Example 2 | Vu | 31 | Yb:RbI | 51.5:48.5 | 2.0 | 3.7 | 6.4 | 12.6 |
| Example 3 | Vu | 31 | Eu:KI | 50:49 | 2.0 | 4.3 | 4.7 | 9.2 |
| Example 4 | Vu | 31 | Ba:KI | 50:50 | 2.0 | 4.3 | 4.5 | 8.8 |

TABLE 2

Electron injection layer comprising a first and second electron injection layer

| | First electron matrix compound | Thickness ETL1/nm | Composition of first electron injection layer (EIL1) | Composition of EIL1 (vol.-%) | Thickness EIL1 (nm) | Composition of second electron injection layer (EIL2) | Composition of EIL2 (vol.-%) | Thickness EIL2 (nm) | Operating voltage at 10 mA/cm² (V) | cd/A efficiency at 10 mA/cm² (cd/A) | EQE efficiency at 10 mA/cm² (%) |
|---|---|---|---|---|---|---|---|---|---|---|---|
| Comparative example 3 | Alq3 | 31 | Yb:KI | 51:49 | 2 | — | — | — | 7.3 | 3.7 | 6.1 |
| Example 5 | Vy | 31 | Yb:KI | 57:43 | 1.8 | — | — | — | 4.1 | 5.9 | 11.6 |
| Example 6 | Vu | 31 | Yb:KI | 56:44 | 1.8 | — | — | — | 3.6 | 6.3 | 12.9 |
| Example 7 | Vu | 31 | KI | 100 | 2 | Yb | 100 | 2 | 3.7 | 6.3 | 12 |
| Example 8 | Vv | 31 | Yb:KI | 57:43 | 1.8 | — | — | — | 3.35 | 7.3 | 14.7 |
| Example 9 | Vw | 31 | Yb:KI | 50:50 | 3.0 | — | — | — | 3.4 | 6.5 | 13.3 |
| Example 10 | Vw | 31 | KI | 100 | 2 | Yb | 100 | 2 | 3.3 | 7.5 | 14.3 |
| Example 11 | Vw | 31 | Yb | 100 | 2 | KI | 100 | 1.5 | 4 | 6.9 | 12.7 |

TABLE 3

First electron transport layer doped with alkali organic complex

| | First electron matrix compound | vol.-% first electron matrix compound | Alkali organic complex | vol.-% alkali organic complex | Thickness ETL/nm | First electron injection layer (EIL1) | vol.-% | Thickness EIL1/nm | Second electron injection layer (EIL2) | vol.-% | Thickness EIL2/nm | Operating voltage at 10 mA/cm² (V) | cd/A efficiency at 10 mA/cm² (cd/A) | EQE efficiency at 10 mA/cm² (%) |
|---|---|---|---|---|---|---|---|---|---|---|---|---|---|---|
| Example 12 | Vv | 50 | LiQ | 50 | 31 | Yb:KI | 91:9 | 1.4 | — | — | — | 3.5 | 7.9 | 16.3 |
| Example 13 | Vu | 50 | LiQ | 50 | 31 | Yb:KI | 92:9 | 1.3 | — | — | — | 3.5 | 7.8 | 16.8 |
| Example 14 | Vu | 75 | Li-1 | 25 | 31 | Yb:KI | 91:9 | 1.3 | — | — | — | 3.2 | 7.5 | 16.2 |
| Example 15 | Vu | 75 | Li-1 | 25 | 31 | Yb:RbI | 50:50 | 1.6 | — | — | — | 3.5 | 6.3 | 13.2 |
| Example 16 | Vx | 74 | Li-1 | 26 | 31 | Yb:KI | 52:48 | 1.5 | — | — | — | 3.15 | 8.8 | 16.1 |
| Example 17 | Vx | 75 | Li-1 | 25 | 32 | KI | 100 | 1.5 | Yb | 100 | 2 | 3.2 | 8.6 | 15.6 |
| Example 18 | Vx | 74 | Li-1 | 26 | 32 | Yb | 100 | 1.5 | KI | 100 | 2 | 3.2 | 8.8 | 15.8 |

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claim. Therefore, the aforementioned embodiments should be understood to be exemplary but not limiting the present invention in any way.

The invention claimed is:

1. An organic electroluminescent device comprising an anode layer, at least one electron transport layer, an electron injection layer, an cathode layer, and an emission layer, wherein
the emission layer is arranged between the anode layer and the cathode layer, wherein
the at least a first electron transport layer and the electron injection layer are arranged between the emission layer and the cathode layer, wherein
the electron injection layer is arranged in direct contact to the first transport electron layer, wherein
the first electron transport layer is arranged nearer to the anode layer and the electron injection layer is arranged nearer to the cathode layer, characterized in that at least the first electron transport layer comprises:
an organic phosphine matrix compound, and
a first zero-valent aka metal; and
the electron injection layer comprises:
a second zero-valent metal of an alkaline earth metal and/or rare earth metal, and
an alkali metal halide;
and wherein the first zero-valent alkali metal of the electron transport layer and the alkali metal of the alkali metal halide of the electron injection layer are the same.

2. The organic electroluminescent device according to claim 1, wherein the first electron transport layer comprises a gradient distribution of the first zero-valent alkali metal.

3. The organic electroluminescent device according to claim 1, wherein the electron injection layer comprises a gradient distribution of the alkali metal halide.

4. The organic electroluminescent device according to claim 1, wherein the electron injection layer comprises a mixture of
the second zero-valent metal, which is an alkaline earth metal and/or rare earth metal, and
the alkali metal halide.

5. The organic electroluminescent device according to claim 1, wherein the first zero-valent alkali metal is selected from Li, Na, K, or Rb.

6. The organic electroluminescent device according to claim 1, wherein the second zero-valent metal, which is an alkaline earth metal and/or rare earth metal, are selected from Mg, Ca, Sr, Ba, Yb, Sm, Eu, Nd, Tb, Gd, Ce, or La.

7. The organic electroluminescent device according to claim 1, wherein the organic phosphine matrix compound comprises at least one P=X group, wherein X is O, S, or Se.

8. The organic electroluminescent device according to claim 1, wherein the organic phosphine matrix compound has a molecular weight of ≥400 and ≤1800 g/mol.

9. The organic electroluminescent device according to claim 1, wherein the organic phosphine matrix compound comprises at least one group selected from:
   triazine,
   pyrimidine,
   $C_{10}$ to $C_{40}$ aryl, wherein at least two rings are annelated,
   $C_3$ to $C_{40}$ heteroaryl, wherein at least two rings are annelated.

10. The organic electroluminescent device according to claim 1, wherein the organic phosphine matrix compound is a compound having the Formula I:

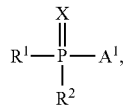

Formula (I)

wherein:
X is selected from O, S, or Se;
$R^1$ and $R^2$ are independently selected from substituted or unsubstituted $C_1$ to $C_{12}$ alkyl, substituted or unsubstituted $C_6$ to $C_{20}$ aryl, or substituted or unsubstituted $C_3$ to $C_{20}$ heteroaryl; or $R^1$ and $R^2$ are bridged with an alkene-di-yl group forming with the P atom a substituted or unsubstituted five, six or seven membered ring;
   wherein the substituent on $C_1$ to $C_{12}$ alkyl is selected from $C_6$ to $C_{18}$ aryl, the substituent on $C_6$ to $C_{20}$ aryl and/or $C_3$ to $C_{20}$ heteroaryl is selected from $C_1$ to $C_{12}$ alkyl or $C_1$ to $C_{12}$ heteroalkyl; and
$A^1$ is substituted or unsubstituted $C_1$ to $C_{12}$ alkyl, substituted or unsubstituted $C_6$ to $C_{40}$ aryl, substituted or unsubstituted $C_3$ to $C_{40}$ heteroaryl,
   wherein the substituent on $C_1$ to $C_{12}$ alkyl is selected from $C_6$ to $C_{18}$ aryl, and the substituent on $C_6$ to $C_{40}$ aryl and/or $C_3$ to $C_{40}$ heteroaryl is selected from $C_1$ to $C_{12}$ alkyl or $C_1$ to $C_{12}$ heteroalkyl;
or
$A^1$ is selected from Formula (II):

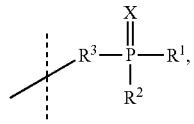

Formula (II)

wherein
$R^3$ is selected from $C_1$ to $C_8$ alkane-di-yl, substituted or unsubstituted $C_6$ to $C_{20}$ arylene, or substituted or unsubstituted $C_3$ to $C_{20}$ heteroarylene,
   wherein the substituent on $C_6$ to $C_{20}$ arylene, and/or $C_3$ to $C_{20}$ heteroarylene is selected from $C_1$ to $C_{12}$ alkyl or $C_1$ to $C_{12}$ heteroalkyl;
or
$A^1$ is selected from Formula (III)

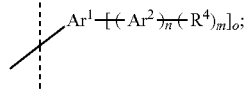

Formula (III)

wherein
n is selected from 0 or 1;
m is selected from 1 or 2;
o is selected from 1 or 2;
and wherein m is 1 if o is 2;
$Ar^1$ is selected from substituted or unsubstituted $C_6$ to $C_{20}$ arylene or substituted or unsubstituted $C_3$ to $C_{20}$ heteroarylene,
   wherein the substituent on $C_6$ to $C_{20}$ arylene or $C_3$ to $C_{20}$ heteroarylene is selected from $C_1$ to $C_{12}$ alkyl and/or $C_1$ to $C_{12}$ heteroalkyl;
$Ar^2$ is selected from substituted or unsubstituted $C_{10}$ to $C_{40}$ arylene or substituted or unsubstituted $C_3$ to $C_{40}$ heteroarylene,
   wherein the substituent on $C_{10}$ to $C_{40}$ arylene or $C_3$ to $C_{40}$ heteroarylene is selected from $C_1$ to $C_{12}$ alkyl, $C_1$ to $C_{12}$ heteroalkyl, OH, CN and/or halogen;
$R^4$ is selected from H, $C_1$ to $C_{12}$ alkyl, substituted or unsubstituted $C_6$ to $C_{20}$ aryl or substituted or unsubstituted $C_3$ to $C_{20}$ heteroaryl,
   wherein the substituent on $C_6$ to $C_{20}$ aryl or $C_3$ to $C_{20}$ heteroaryl is selected from $C_1$ to $C_{12}$ alkyl, $C_1$ to $C_{12}$ heteroalkyl, $C_6$ to $C_{20}$ aryl, $C_5$ to $C_{20}$ heteroaryl, OH, CN and/or halogen.

11. The organic electroluminescent device according to claim 10, wherein
$Ar^1$ is selected from substituted $C_6$ to $C_{20}$ arylene, and/or substituted $C_3$ to $C_{20}$ heteroarylene, wherein the $C_6$ to $C_{20}$ arylene, and/or $C_3$ to $C_{20}$ heteroarylene is substituted with at least one $C_1$ to $C_{12}$ alkyl and/or at least one $C_1$ to $C_{12}$ heteroalkyl group; or
$Ar^2$ is selected from substituted $C_{10}$ to $C_{40}$ arylene and/or substituted $C_3$ to $C_{40}$ heteroarylene, wherein the $C_{18}$ to $C_{40}$ arylene and/or $C_3$ to $C_{40}$ heteroarylene is substituted with at least one $C_1$ to $C_{12}$ alkyl and/or at least one $C_1$ to $C_{12}$ heteroalkyl group.

12. The organic electroluminescent device according to claim 10, wherein
$Ar^1$ is selected from substituted $C_6$ to $C_{20}$ arylene and/or substituted $C_3$ to $C_{20}$ heteroarylene,
   wherein the $C_6$ to $C_{20}$ arylene and/or $C_3$ to $C_{20}$ heteroarylene is substituted with at least one $C_1$ to $C_6$ alkyl and/or $C_1$ to $C_6$ heteroalkyl group; or
$Ar^2$ is selected from substituted $C_{10}$ to $C_{40}$ arylene and/or substituted $C_3$ to $C_{40}$ heteroarylene,
   wherein the $C_{18}$ to $C_{40}$ arylene and/or $C_3$ to $C_{40}$ heteroarylene is substituted with at least one $C_1$ to $C_6$ alkyl and/or $C_1$ to $C_6$ heteroalkyl group.

13. The organic electroluminescent device according to claim 10, wherein
$Ar^1$ is selected from substituted $C_6$ to $C_{20}$ arylene and/or substituted $C_3$ to $C_{20}$ heteroarylene,
   wherein the $C_6$ to $C_{20}$ arylene and/or $C_3$ to $C_{20}$ heteroarylene is substituted with at least one $C_1$ to $C_4$ alkyl and/or $C_1$ to $C_4$ heteroalkyl group; or
$Ar^2$ is selected from substituted $C_{10}$ to $C_{40}$ arylene and/or substituted $C_3$ to $C_{40}$ heteroarylene,
   wherein the $C_{18}$ to $C_{40}$ arylene and/or $C_3$ to $C_{40}$ heteroarylene is substituted with at least one $C_1$ to $C_4$ alkyl and/or $C_1$ to $C_4$ heteroalkyl group.

14. The organic electroluminescent device according to claim 10, wherein the compound of Formula (I) is selected from a compound according to:

Formula Va to Vz:
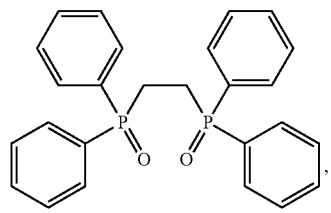 (Va)
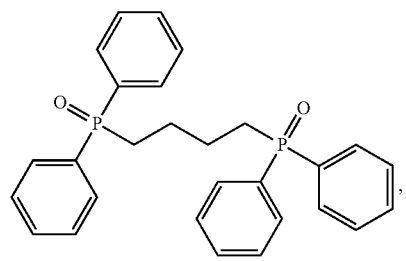 (Vb)
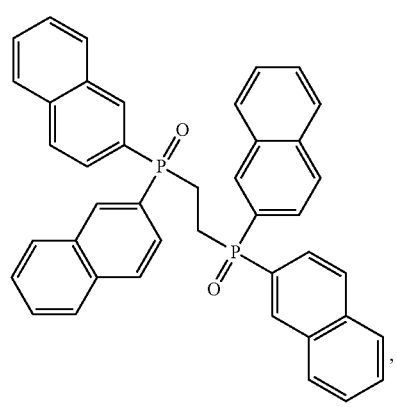 (Vc)
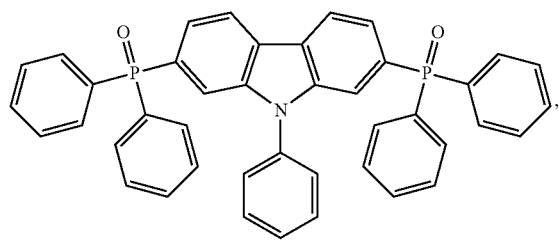 (Vd)
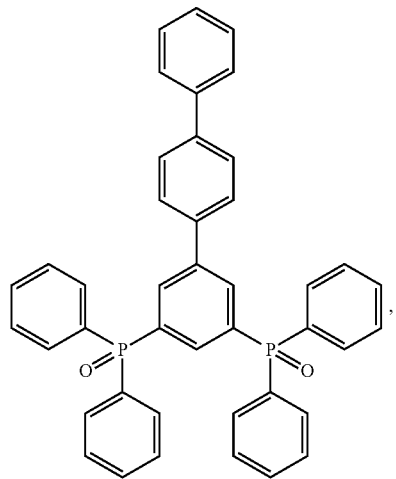 (Ve)
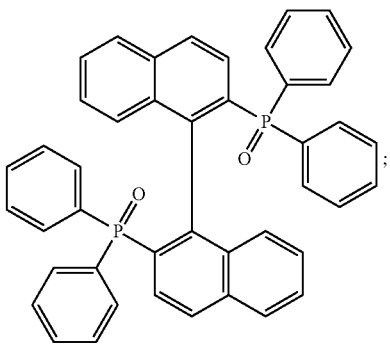 (Vf)
or
Formula Vg to Vx:
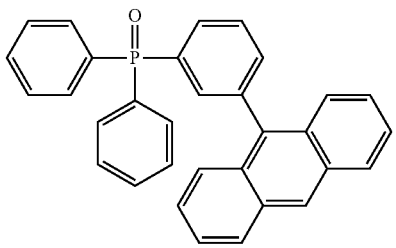 (Vg)
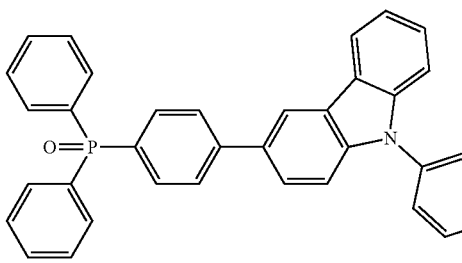 (Vh)
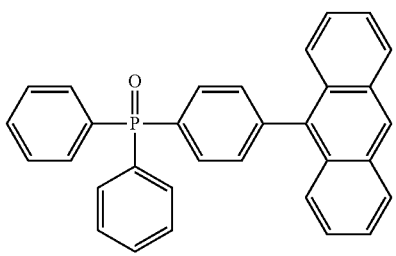 (Vi)
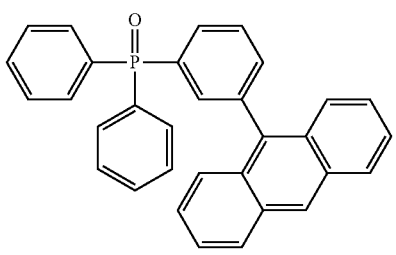 (Vj)

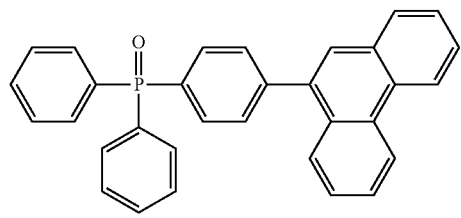
(Vk)
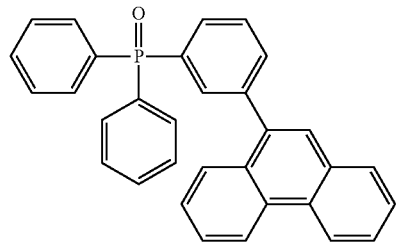
(Vl)
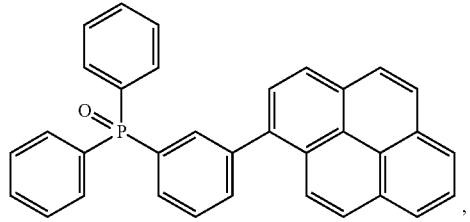
(Vm)
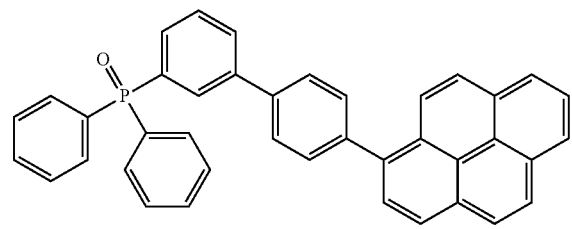
(Vn)
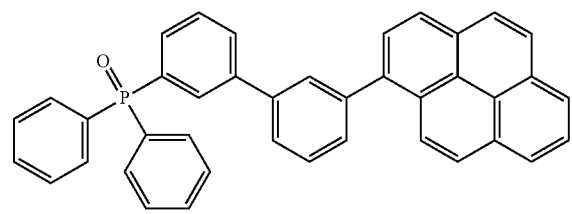
(Vo)
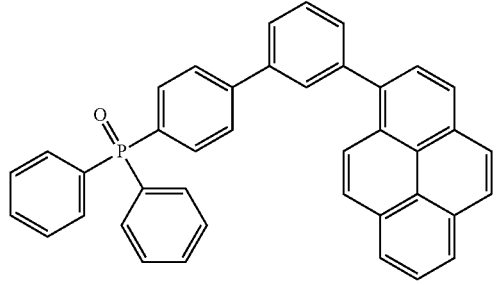
(Vp)
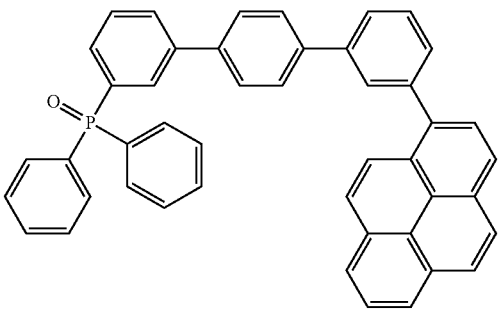
(Vq)
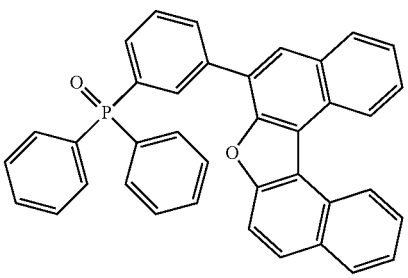
(Vr)
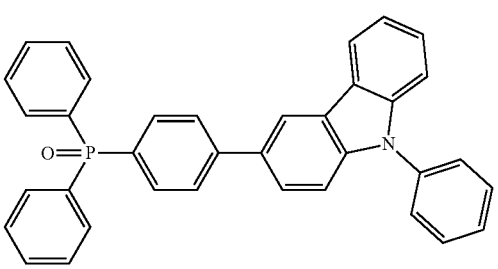
(Vs)
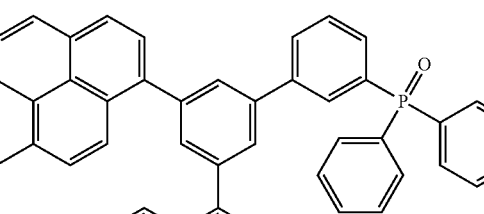
(Vt)

-continued

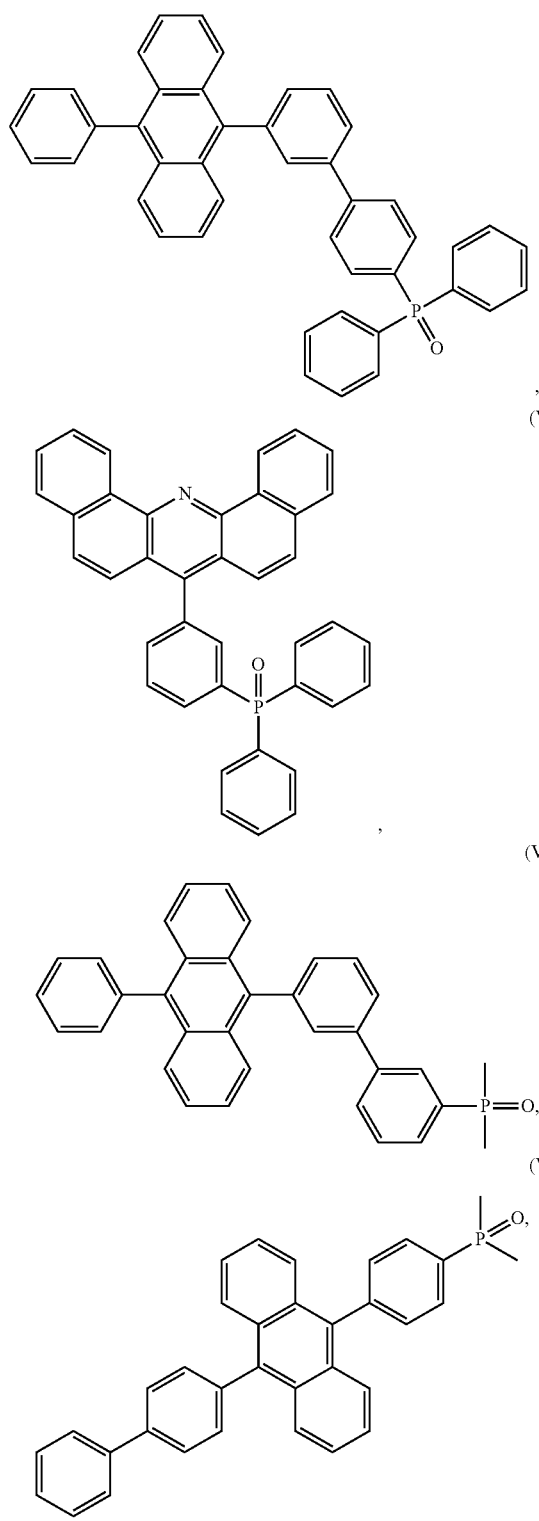

Formula Vy, Vy1, Vz:

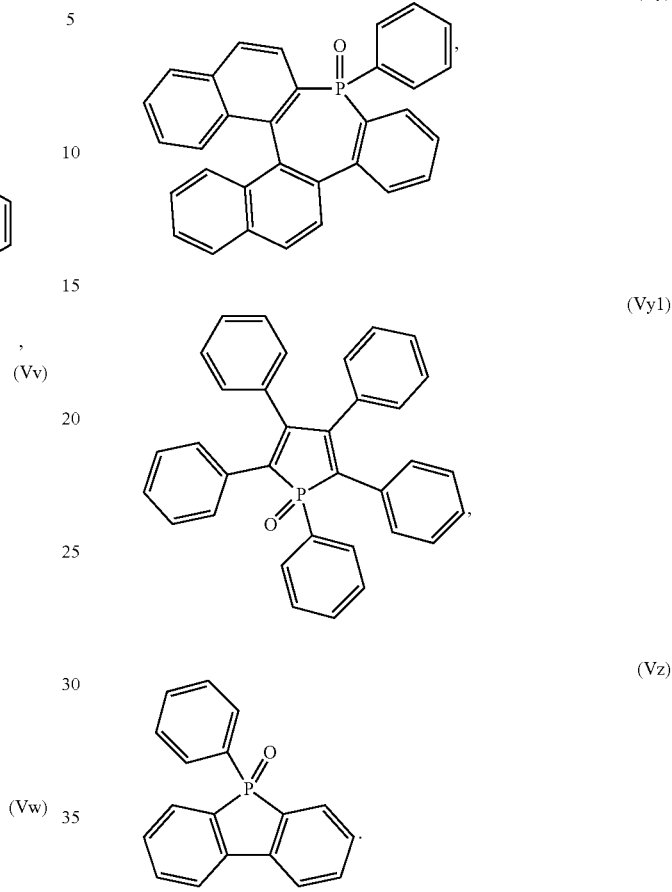

15. The organic electroluminescent device according to claim 1, wherein the electronic device is a display device, a light emitting device, a thin film transistor, a battery or a photovoltaic cell.

16. A method of manufacture of at least a first electron transport layer and an electron injection layer of an organic electroluminescent device according to claim 1, comprising the steps of:
    forming a first electron transport layer, comprising an organic phosphine matrix compound; and
    forming an electron injection layer, comprising an alkali metal halide and a second zero-valent metal, which is a rare earth metal and/or alkaline earth metal, directly onto the first electron transport layer;
wherein the second zero-valent metal, which is a rare earth metal and/or alkaline earth metal reduces the alkali halide to a first zero-valent alkali metal and the obtained first zero-valent alkali metal diffuses into the organic phosphine matrix compound of the first electron transport layer.

* * * * *